United States Patent
Higashibata et al.

(10) Patent No.: US 8,422,241 B2
(45) Date of Patent: Apr. 16, 2013

(54) SEALED ELECTRONIC CONTROL DEVICE AND METHOD OF FABRICATING THE SAME

(75) Inventors: Shinji Higashibata, Chiyoda-ku (JP);
Shozo Kanzaki, Chiyoda-ku (JP);
Hiroyoshi Nishizaki, Chiyoda-ku (JP);
Fumiaki Arimai, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 245 days.

(21) Appl. No.: 12/970,124

(22) Filed: Dec. 16, 2010

(65) Prior Publication Data
US 2011/0317389 A1    Dec. 29, 2011

(30) Foreign Application Priority Data

Jun. 28, 2010  (JP) ................... 2010-146498

(51) Int. Cl.
*H05K 5/00* (2006.01)
*H05K 1/11* (2006.01)
*H05K 1/14* (2006.01)

(52) U.S. Cl.
USPC .......................... 361/758; 361/804

(58) Field of Classification Search .......... 361/758, 361/784, 790, 804; 257/668, 686, 724, 777
See application file for complete search history.

(56) References Cited

U.S. PATENT DOCUMENTS

| | | | | |
|---|---|---|---|---|
| 5,334,875 A * | 8/1994 | Sugano et al. | ................ | 257/686 |
| 6,069,025 A | 5/2000 | Kim | | |
| 6,477,058 B1 * | 11/2002 | Luebs et al. | .................. | 361/784 |
| 6,801,431 B2 * | 10/2004 | Hartke et al. | ................ | 361/704 |
| 6,801,440 B2 * | 10/2004 | Inoue et al. | .................... | 361/803 |
| 7,719,850 B2 * | 5/2010 | Duerbaum et al. | ........... | 361/760 |
| 7,745,923 B2 * | 6/2010 | Hirose et al. | .................. | 257/698 |
| 7,813,144 B2 * | 10/2010 | Maeda | .......................... | 361/809 |
| 8,018,731 B2 * | 9/2011 | Sakurai et al. | ................ | 361/770 |
| 8,023,279 B2 * | 9/2011 | Qian et al. | .................... | 361/764 |
| 2002/0044433 A1 * | 4/2002 | Inoue et al. | .................. | 361/784 |

(Continued)

FOREIGN PATENT DOCUMENTS

| | | |
|---|---|---|
| JP | 60-244055 A | 12/1985 |
| JP | 04-007867 A | 1/1992 |

(Continued)

*Primary Examiner* — Lisa Lea Edmonds
*Assistant Examiner* — Xanthia C Cunningham
(74) *Attorney, Agent, or Firm* — Sughrue Mion, PLLC

(57) ABSTRACT

Provided is a small resin-sealed electronic control device with a reduced plane area and volume, which can provide an enlarged area on which circuit components are mounted without increasing a plane area of electronic boards. In the resin-sealed electronic control device, a support member (20A) includes a first support plate (21a), a second support plate (22a), and a pair of rising portions (23a) which form a space portion with a first electronic board (30A) and a second electronic board (40A). An exterior covering material (11) is formed by injecting a melted synthetic resin into the space portion and spaces outside the space portion along the pair of rising portions (23a). Inner circuit components (33) are situated inside window holes formed through the support plate (20A) and face one of the first electronic board (30A) and the second electronic board (40A) opposed to each other with a gap interposed therebetween.

12 Claims, 16 Drawing Sheets

U.S. PATENT DOCUMENTS

| | | | |
|---|---|---|---|
| 2002/0054486 A1* | 5/2002 | Miyajima et al. | 361/803 |
| 2005/0168961 A1* | 8/2005 | Ono et al. | 361/784 |
| 2006/0146507 A1* | 7/2006 | Lee | 361/758 |
| 2007/0215380 A1* | 9/2007 | Shibamoto | 174/260 |
| 2007/0297158 A1* | 12/2007 | Lee | 361/790 |
| 2008/0122075 A1 | 5/2008 | Bauer et al. | |
| 2008/0123312 A1* | 5/2008 | Cheng et al. | 361/790 |

FOREIGN PATENT DOCUMENTS

| | | |
|---|---|---|
| JP | 07-283335 A | 10/1995 |
| JP | 2004-158892 A | 6/2004 |
| JP | 2004-281722 A | 10/2004 |
| JP | 2009-130230 A | 6/2009 |
| JP | 2010-056355 A | 3/2010 |

* cited by examiner

SEALED ELECTRONIC CONTROL DEVICE AND METHOD OF FABRICATING THE SAME

BACKGROUND OF THE INVENTION

1. Field of the Invention

The present invention relates to a resin-sealed electronic control device suitable, for example, as an on-vehicle electronic control device, and a method of fabricating the same.

2. Description of the Related Art

As a control device for an automobile transmission, an integrated resin-sealed electronic control device mounted inside the transmission is widely put into practical use. The on-vehicle electronic control device as described above includes any one of a ceramic board and a polyimide board bonded to a support plate serving as a thermal diffuser plate. The entire on-vehicle electronic control device except for a part of external connection terminals and a part of the support plate is integrally formed with a thermosetting resin.

For example, the invention entitled "Electronic Circuit Apparatus and Method of Manufacturing the Same", which is described in Japanese Patent Application Laid-open No 2004-281722 (FIG. 1 and Abstract), discloses a resin-sealed electronic circuit apparatus with a high heat-dissipating property and a high packaging density in applications where high hermetic-sealing property and durability are required. In the electronic circuit apparatus, at least two wiring boards, on which electronic components are mounted, are fixedly bonded to a highly thermally conductive thermal diffuser plate through an intermediation of an adhesive. The entire wiring boards, the entire thermal diffuser plate, and a part of an external connection terminal are hermetically sealed by and integrally molded with a thermosetting resin composition. In this manner, the small and highly reliable electronic circuit apparatus can be provided at low cost.

Specifically, the aforementioned electronic circuit apparatus includes: a multilayered wiring board on which at least two electronic components are mounted; a polyimide wiring board on which heating elements are mounted; the thermal diffuser plate having a higher thermal conductivity than those of the multilayered wiring board and the polyimide wiring board; and an external connection terminal. The electronic circuit apparatus is a control unit for an automobile, which has the following structure. The multilayered wiring board is fixedly bonded to one surface of the thermal diffuser plate through an intermediation of the adhesive, whereas the polyimide wiring board is fixedly bonded to the other surface of the thermal diffuser plate through an intermediation of an adhesive. The polyimide wiring board is bent to be fixedly bonded so that an upper surface and a lower surface of the thermal diffuser plate are connected to each other. In this manner, the polyimide wiring board and the multilayered wiring board are electrically connected to each other. The multilayered wiring board, the polyimide wiring board, and the external connection terminal are electrically connected to each other. The entire surface of the multilayered wiring board, the entire surface of the polyimide wiring board, a part of the thermal diffuser plate, and a part of the external connection terminal are integrally molded with the thermosetting resin composition. The multilayered wiring board and the polyimide wiring board, and the external connection terminal are connected to each other by a bonding wire.

In the invention entitled "Electronic Circuit Apparatus and Method of Manufacturing the Same" described in Japanese Patent Application Laid-open No. 2004-281722 cited above, the wiring board is divided into two pieces so as to be fixedly bonded onto two surfaces of the thermal diffuser plate. As a result, an area of the wiring board is halved, while the heat-dissipating property is improved. The polyimide wiring board (flexible board) is used as one of the wiring boards so that the polyimide wiring board is bent to be connected to the ceramic board which is the other board.

However, each of the wiring boards is a one-sided board for bonding to the thermal diffuser plate. Therefore, in order to ensure an area on which the circuit components are mounted, there arises problem in that it is necessary to increase a plane area of each of the wiring boards.

Moreover, if the area of each of the wiring boards is large, there is another problem in that the wiring board is likely to be separated from a molded exterior covering material with repeating changes in temperature due to a difference in linear expansion coefficient.

SUMMARY OF THE INVENTION

The present invention has been made to solve the problems described above, and therefore has an object to provide a small resin-sealed electronic control device, in which a plurality of circuit components are mounted on two surfaces of at least one of two electronic boards to increase areas on which the circuit components are mounted without increasing a plane area of each of the electronic boards so as to prevent a plane area and a volume of the resin-sealed electronic control device from being increased.

The present invention has another object to provide a method of fabricating the resin-sealed electronic control device, which prevents the electronic boards from being deformed under a molding pressure when a heated and melted synthetic resin is injected under pressure into a die to form an exterior covering material by molding.

A resin-sealed electronic control device according to the present invention includes:

external connection terminals electrically connected to an external apparatus;

a first electronic board and a second electronic board, at least one of the first electronic board and the second electronic board having two surfaces on both of which a plurality of circuit components are mounted;

a support member onto which the first electronic board and the second electronic board are bonded; and an exterior covering material covering each of the entire first electronic board and the entire second electronic board, the external connection terminals, and the support member with a synthetic resin so that the external connection terminals and the support member are partially exposed therefrom, in which:

the support member includes: a first support portion to which the first electronic board is bonded; a second support portion to which the second electronic board is bonded; and a pair of spacer portions provided to keep the second support portion and the first support portion at a distance from each other, the pair of spacer portions being opposed to each other and forming a space portion with the first electronic board and the second electronic board;

the exterior covering material is formed by injecting the synthetic resin being heated and melted, into the space portion and spaces outside the space portion along the pair of spacer portions;

the plurality of circuit components include: inner circuit components provided inside the space portion; and outer circuit components provided outside the space portion; and the inner circuit components are situated inside one of a window hole formed through the support member or a depressed portion provided to the support member so that the inner circuit components are prevented from being brought into contact with the support member, the inner circuit components facing one of the first electronic board and the second electronic board, the first electronic board and the second electronic board being opposed to each other, with a gap interposed therebetween.

Further, a method of fabricating the resin-sealed electronic control device according to the present invention includes:

fabricating an unmolded body by: previously bonding the first electronic board and the second electronic board to the support member by curing adhesives with heating; and electrically connecting the external connection terminals to any one of the first electronic board and the second electronic board so that the first electronic board and the second electronic board are electrically connected to each other; and electrically connecting the first electronic board and the second electronic board to each other; and forming the exterior covering material by molding by placing the unmolded body in a die and then injecting the synthetic resin being heated and melted, under pressure along the spacer portions without being interfered by the external connection terminals.

According to the resin-sealed electronic control device of the present invention, the plurality of circuit components are mounted on two surfaces of at least one of two electronic boards to increase areas on which the circuit components are mounted without increasing a plane area of each of the electronic boards, to thereby prevent a plane area and a volume of the resin-sealed electric control device from being increased for downsizing.

Further, according to the method of fabricating the resin-sealed electronic control device of the present invention, the electronic boards can be prevented from being deformed under a molding pressure because the heated and melted synthetic resin is injected under pressure into a die along the spacer portions to form the exterior covering material by molding.

BRIEF DESCRIPTION OF THE DRAWINGS

In the accompanying drawings:

FIG. 13A is a top view illustrating an electronic control device 10D according to a fourth embodiment of the present invention before the electronic control device 10D is sealed with a resin, whereas

DETAILED DESCRIPTION OF THE PREFERRED EMBODIMENTS

Hereinafter, each embodiment of the present invention is described with reference to the drawings. In each of the drawings, the same or equivalent members and portions are denoted by the same reference symbols for description.

First Embodiment

Figure 1A:
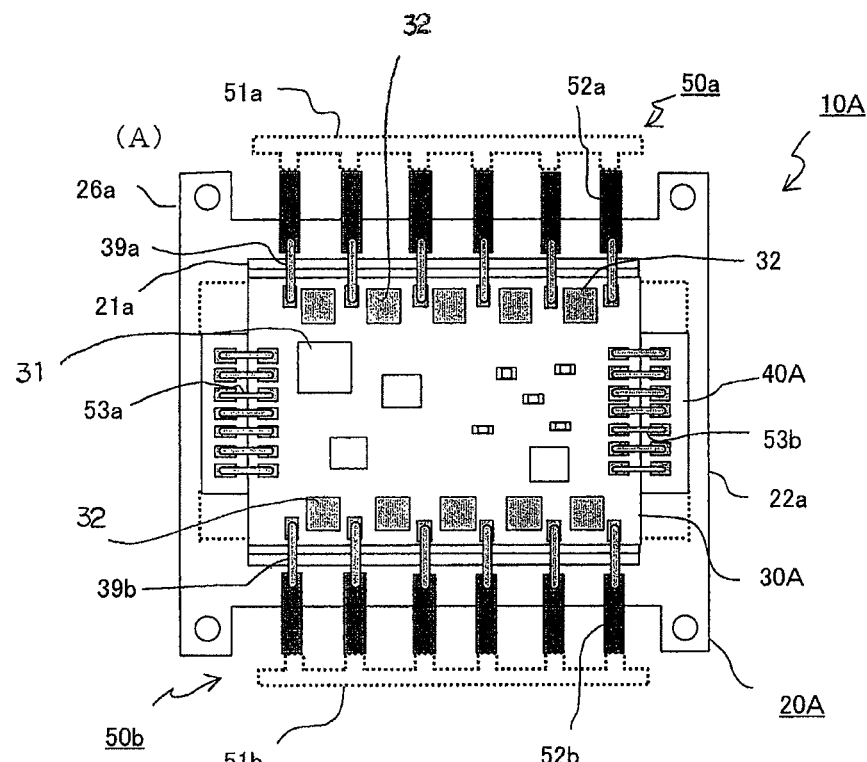
FIG. 1A is a top view illustrating a resin-sealed electronic control device according to a first embodiment of the present invention before the electronic control device is sealed with a resin.
Figure 1B:
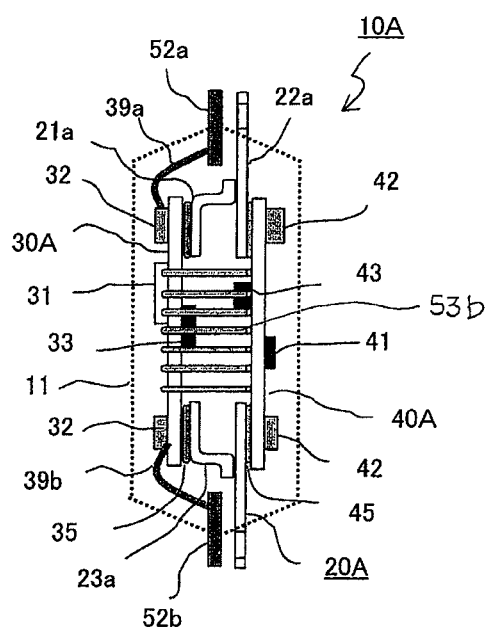
FIG. 1B is a right side view of FIG. 1A.
Figure 2A:
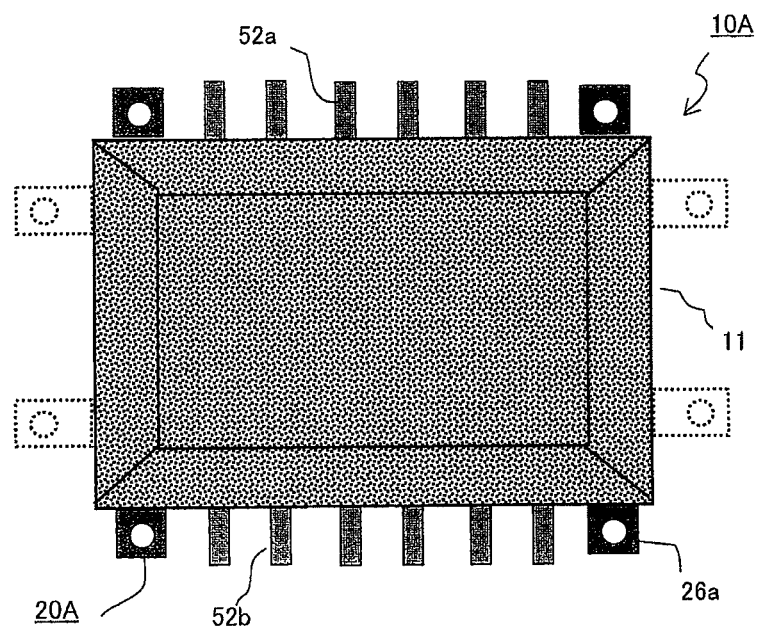
FIG. 2A is a top view illustrating the electronic control device illustrated in FIGS. 1A and 1B after the electronic control device is sealed with the resin.
Figure 2B:
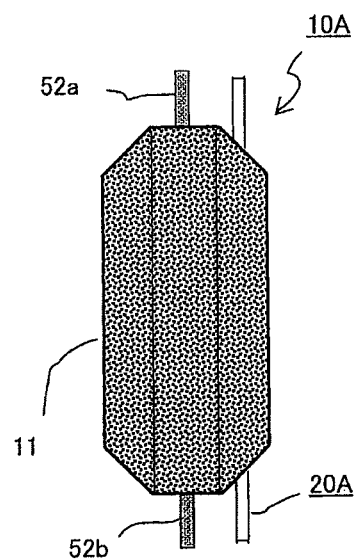
FIG. 2B is a right side view of FIG. 2A.
Figure 3A:
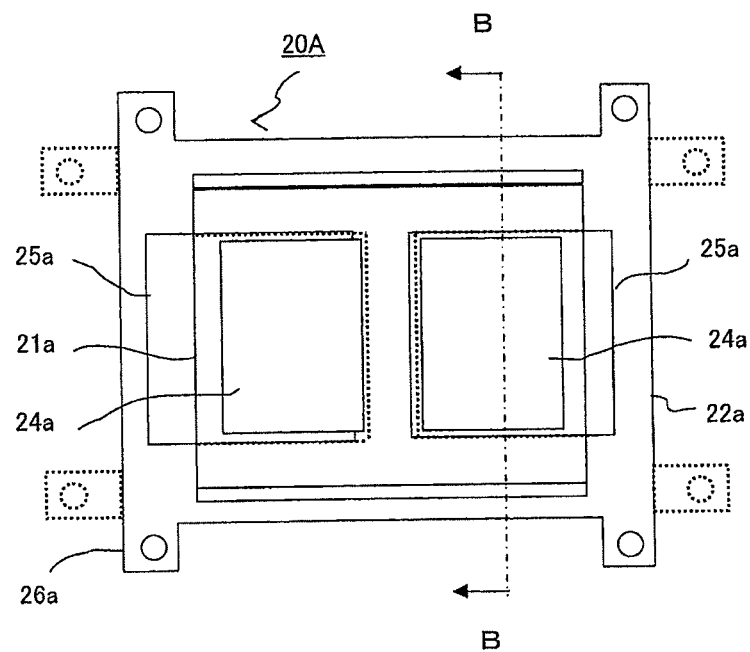
FIG. 3A is a top view of a support member 20A illustrated in FIGS. 1A and 1B.
Figure 3B:
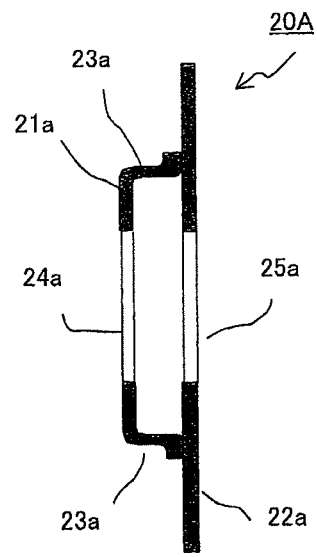
FIG. 3B is a sectional view taken along the line B-B of FIG. 3A.

FIG. 1A is a top view illustrating a resin-sealed electronic control device (hereinafter, abbreviated as "electronic control device") 10A according to a first embodiment of the present invention before the electronic control device 10A is sealed with a resin, whereas FIG. 1B is a right side view of FIG. 1A. FIG. 2A is a top view illustrating the electronic control device 10A illustrated in FIGS. 1A and 1B after the electronic control device 10A is sealed with the resin, whereas FIG. 2B is a right side view of FIG. 2A. FIG. 3A is a top view of a support member 20A illustrated in FIGS. 1A and 1B, whereas FIG. 3B is a sectional view taken along the line B-B of FIG. 3A.

The electronic control device 10A is a transmission control device for an automobile transmission and includes the support member 20A, a first electronic board 30A, a second electronic board 40A, and a large number of external connection terminals 52a and 52b. The support member 20A includes a first support plate 21a and a second support plate 22a. The first electronic board 30A is bonded to be fixed to an upper surface of the support member 20A by an adhesive 35, whereas the second electronic board 40A is bonded to be fixed to a lower surface of the support member 20A by an adhesive 45. The first electronic board 30A and the second electronic board 40A are electrically connected to each other through an intermediation of bonding wires 53a and 53b. The large number of external connection terminals 52a and 52b are electrically connected to the first electronic board 30A through an intermediation of bonding wires 39a and 39b.

The electronic control device 10A further includes outer circuit components 31, heat-generating components 32, inner circuit components 33, outer circuit components 41, heat-generating components 42, inner circuit components 43, and an exterior covering material 11. The outer circuit components 31 and the heat-generating components 32 are mounted on an outer mounting surface of the first electronic board 30A, whereas the inner circuit components 33 are mounted on an inner mounting surface of the first electronic board 30A. The outer circuit components 41 and the heat-generating components 42 are mounted on an outer mounting surface of the second electronic board 40A, whereas the inner circuit components 43 are mounted on an inner mounting surface of the second electronic board 40A. The exterior covering material 11 is made of a thermosetting resin and covers all of the first electronic board 30A, the second electronic board 40A, the bonding wires 39a, 39b, 53a, and 53b, the outer circuit components 31 and 41, the inner circuit components 33 and 43, and the heat-generating components 32 and 42. The exterior covering material 11 also covers the support member 20A and the external connection terminals 52a and 52b so that the support member 20A and the external connection terminals 52a and 52b are partially exposed therefrom.

The first support plate 21a corresponding to a first support portion of the support member 20A has a pair of window holes 24a formed in the center. Moreover, rising portions 23a are formed on both longitudinal sides of the first support plate 21a having a rectangular shape. Each of the rising portions 23a is formed so as to be bent and to rise in an L shape. By the rising portions 23a corresponding to a pair of spacer portions, the first electronic board 30A and the second electronic board 40A are kept at a distance from each other.

The second support plate 22a corresponding to a second support portion of the support member 20A has a pair of window holes 25a formed in the center. Moreover, mounting feet 26a are formed at four corners of the second support plate 22a having a rectangular shape so as to project along a lateral direction to be exposed from the exterior covering material 11.

The first support plate 21a and the second support plate 22a, each being made of, for example, a highly thermally conductive sheet metal material and therefore having a high thermal conductivity, are integrated with each other by welding, brazing, or bonding.

The mounting feet 26a may alternatively project along a longitudinal direction of the second support plate 22a, as indicated by dotted lines of FIG. 3A.

Both longitudinal sides (first edges extending along the rising portions 23a) of the rectangular first electronic board 30A made of, for example, glass epoxy, are bonded and fixed onto a heat-transfer surface of the first support plate 21a by the adhesive 35. The adhesive 35 is, for example, a thermosetting silicon resin composition.

Similarly to the outer circuit components 31, the plurality of heat-generating components 32 are provided on the outer mounting surface of the first electronic board 30A. The heat-generating components 32 are arranged at intervals in areas of the first electronic board 30A along both longitudinal sides, the areas being in the positions vertically corresponding to the first support plate 21a.

The inner circuit components 33 mounted on the inner mounting surface of the first electronic board 30A are situated inside the window holes 24a of the first support plate 21a. A height size of each of the inner circuit components 33 is determined so that the inner circuit components 33 do not abut at least against the inner mounting surface of the second electronic board 40A, specifically, the height size of each of the inner circuit components 33 is smaller than a height size of each of the rising portions 23a.

Both longitudinal sides (first edges extending along the rising portions 23a) of the rectangular second electronic board 40A made of, for example, glass epoxy, are bonded and fixed onto a heat-transfer surface of the second support plate 22a by the adhesive 45. The adhesive 45 is, for example, a thermosetting silicon resin composition. Similarly to the outer circuit components 41, the plurality of heat-generating components 42 are arranged on the outer mounting surface of the second electronic board 40A. The heat-generating components 42 are arranged at intervals in areas of the second electronic board 40A along both the longitudinal sides of the second electronic board 40A, the areas being in the positions vertically corresponding to the second support plate 22a.

The inner circuit components 43 mounted on the inner mounting surface of the second electronic board 40A are situated inside the window holes 25a of the second support plate 22a. A height size of each of the inner circuit components 43 is determined so that the inner circuit components 43 do not abut at least against the inner mounting surface of the first electronic board 30A, specifically, the height size of each of the inner circuit components 43 is smaller than the height size of each of the rising portions 23a.

A plurality of connection lands are provided in areas of the outer mounting surface of the first electronic board 30A along lateral sides (second edges extending between the pair of rising portions 23a which are opposed to each other). Similarly, a plurality of connection lands are provided in areas of the inner mounting surface of the second electronic board 40A along the lateral sides (second edges extending between the pair of rising portions 23a which are opposed to each other). The connection lands of the first electronic board 30A and the connection lands of the second electronic board 40A are connected to each other by the plurality of bonding wires 53a and 53b, each of which is, for example, a thin aluminum wire. In this manner, the first electronic board 30A and the second electronic board 40A are electrically connected to each other.

A plurality of connection lands are provided in the areas of the outer mounting surface of the first electronic board 30A along both the first edges. The connection lands are electrically connected to the large number of external connection terminals 52a and 52b by the bonding wires 39a and 39b, each of which is, for example, a thin aluminum wire.

Each of the large number of external connection terminals 52a and 52b has a distal end which extends vertically with respect to both the first edges of the first electronic board 30A. Until a last step of assembly, the external connection terminals 52a are elements constituting a group terminal plate 50a, whereas the external connection terminals 52b are elements constituting a group terminal plate 50b. In the last step of assembly, the external connection terminals 52a and 52b are separated into individual pieces by cutting cutout connection portions 51a and 51b.

The large number of external connection terminals 52a and 52b may be electrically connected to the second electronic board 40A instead of being electrically connected to the first electronic board 30A.

Figure 4:
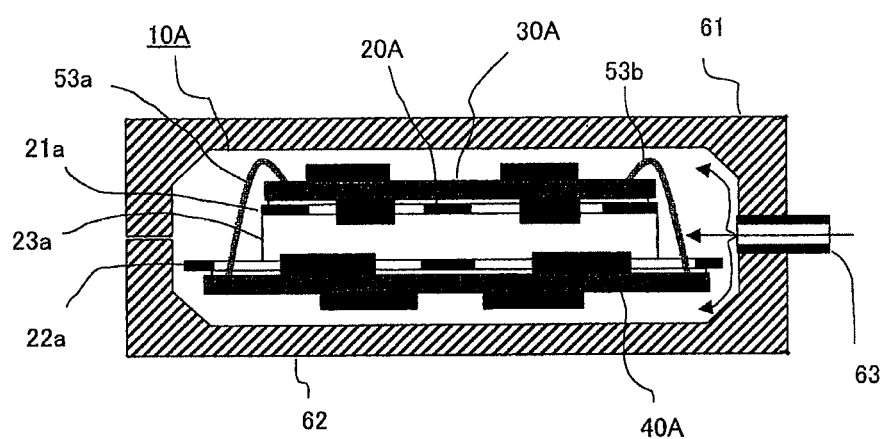
FIG. 4 is a sectional view of a molding die used for the fabrication of the electronic control device illustrated in FIGS. 1A and 1B.

FIG. 4 is a sectional view of a molding die used for the fabrication of the electronic control device 10A illustrated in FIGS. 1A and 1B.

Inside the molding die constituted by an upper die 61 and a lower die 62, an unmolded body of the electronic control device 10A (illustrated in FIGS. 1A and 1B) before being molded with the resin is placed. Specifically, in the unmolded body of the electronic control device 10A, the external connection terminals 52a and 52b are connected to the first electronic board 30A through an intermediation of the bonding wires 39a and 39b, respectively, as illustrated in FIGS. 1A and 1B.

A resin injection port 63 is provided in the center position of the molding die on the side where the bonding wires 53b are provided.

A thermosetting resin, which is heated and melted, is injected under pressure through the resin injection port 63 into a space closed by the upper die 61 and the lower die 62. The thermosetting resin is, for example, an epoxy resin composition.

A flow of the synthetic resin injected through the resin injection port 63 under pressure is split into three streams, as indicated by arrows of FIG. 4. A first stream flows into an upper space above the outer mounting surface of the first electronic board 30A, a second stream flows into a space portion surrounded by the first electronic board 30A, the second electronic board 40A, and the pair of rising portions 23a, and a third stream flows into a lower space under the outer mounting surface of the second electronic board 40A. Then, the three streams join together downstream, that is, on the side where the bonding wires 53a are provided.

The thermosetting resin has a characteristic of not being softened or melted by re-heating once cured after heating and melting. Therefore, the gel-like adhesive 35, which is the thermosetting resin composition for connecting the support member 20A and the first electronic board 30A to each other, and the gel-like adhesive 45, which is the thermosetting resin composition for connecting the support member 20A and the second electronic board 40A to each other, are not softened at the time of heat-molding of the exterior covering material 11 by being thermally cured after the application and the bonding.

A thermoplastic resin may alternatively be used for the exterior covering material 11. If the thermoplastic resin is used, the exterior covering material 11 is melted by re-heating. Therefore, the components included in the electronic control device 10A can be collected separately after the use.

As described above, according to the electronic control device 10A of this first embodiment, the support member 20A includes the first support plate 21a and the second support plate 22a. The first support plate 21a is made of the rectangular sheet metal material and has rising ends on both longitudinal sides as the rising portions 23a which correspond to the spacer portions, whereas the second support plate 22a is a flat plate made of the rectangular sheet metal material, which is fixedly bonded to the ends of the rising portions 23a. The first electronic board 30A having the outer mounting surface on which the outer circuit components 31 are mounted and the inner mounting surface on which the inner circuit components 33 are mounted is bonded to the first support plate 21a having the window holes 24a, whereas the second electronic board 40A having the outer mounting surface on which the outer circuit components 41 are mounted and the inner mounting surface on which the inner circuit components 43 are mounted is bonded to the second support plate 22a having the window holes 25a.

Therefore, the support member 20A supports the first electronic board 30A and the second electronic board 40A, each having two surfaces on both of which the components are mounted, so that the first electronic board 30A and the second electronic board 40A are kept at a distance from each other. Thus, the areas on which the circuit components 31, 33, 41, and 43 are mounted can be increased without increasing a plane area of each of the electronic boards. As a result, a plane area and a volume of the entire electronic control device 10A can be prevented from being increased.

Moreover, the support member 20A is made of the highly thermally conductive sheet metal material. Therefore, heat-radiation efficiency for the heat-generating components 32 and 42 corresponding to the outer circuit components is high. In addition, the heat-generating components 32 and 42 are provided in regions which are in the positions vertically corresponding to the support member 20A. Specifically, the support member 20A is provided so as to be held in contact with an inner surface of the first electronic board 30A which carries the heat-generating components 32 mounted on the outer mounting surface thereof and an inner surface of the second electronic board 40A which carries the heat-generating components 42 mounted on the outer mounting surface thereof.

Therefore, the heat-generating components 32 and the heat-generating components 42 are not mounted on both surfaces of the first electronic board 30A and both surfaces of the second electronic board 40A, respectively, so that the heat-generating components 32 and 42 are located in the positions vertically corresponding to each other. Thus, the heat generated from the heat-generating components 32 and 42 is efficiently radiated through an intermediation of the support member 20A. As a result, a temperature can be prevented from being locally excessively high.

Moreover, the external connection terminals 52a and 52b, each having the distal end extending vertically with respect to the rising portions 23a corresponding to the spacer portions, are arranged at intervals along the rising portions 23a. Moreover, the resin injection port 63 of the die is formed so as to be oriented to the space portion surrounded by the first electronic board 30A, the second electronic board 40A, and the pair of rising portions 23a, the space portion being located between the pair of rising portions 23a which are opposed to each other. The heated and melted synthetic resin is injected under pressure into the die through the resin injection port 63.

Thus, the external connection terminals 52a and 52b do not interfere with the injection of the synthetic resin under pressure. Accordingly, a structure of the die is simplified.

Moreover, the first electronic board 30A and the second electronic board 40A are electrically connected to each other by the bonding wires 53a and 53b at the second edges extending between the rising portions 23a which are opposed to each other.

Specifically, the bonding wires 53a and 53b are located on the sides of the second edges corresponding to lateral sides of the first electronic board 30A and the second electronic board 40A. On the other hand, the external connection terminals 52a and 52b are located on the sides of the first edges of the first electronic board 30A, the first edges corresponding to the longitudinal sides. In this manner, the positions where the electronic wirings are connected are distributed. As a result, an overall size of the electronic control device 10A can be reduced.

Moreover, the plurality of board-to-board connection lands are provided at intervals to the first electronic board 30A and the second electronic board 40A along the second edges. The ends of each of the bonding wires 53a and 53b are respectively connected to a corresponding one of the board-to-board connection lands provided to the first electronic board 30A and a corresponding one of the second electronic board 40A, and hence, the first electronic board 30A and the second electronic board 40A are electrically connected to each other.

Thus, the heated and melted synthetic resin passes through interspaces between the adjacent bonding wires 53a and 53b. Accordingly, the synthetic resin can smoothly flow into the die.

Further, the synthetic resin flows into the die along a direction in which each of the bonding wires 53a and 53b is provided to extend. Therefore, a load applied to the bonding wires 53a and 53b at the time of the injection of the synthetic resin under pressure is reduced to prevent the bonding wires 53a and 53b from being broken.

Further, the first electronic board 30A and the second electronic board 40A are previously bonded to the support member 20A by curing the adhesives 35 and 45 with heating. Then, the external connection terminals 52a and 52b are electrically connected to the first electronic board 30A. The first electronic board 30A and the second electronic board 40A are electrically connected by the bonding wires 39a and 39b to fabricate the unmolded body. After the fabrication of the unmolded body in the manner described above, the unmolded body is placed inside the die. Then, the heated and melted synthetic resin is injected under pressure into the die along the rising portions 23a to form the exterior covering material 11 by molding.

Therefore, the adhesives 35 and 45, each being the thermosetting resin, are not melted or softened by the heat of the melt synthetic resin at the time of pressure-molding. Therefore, all the components are reliably integrated with each other.

Further, the flow of the synthetic resin, which is injected under pressure, is split inside the die into the streams flowing in the three directions, that is, into the space portion, into the upper space above the first electronic board 30A, and into the lower space below the second electronic board 40A. Therefore, the pressure is distributed at the time of the injection of the synthetic resin under pressure, and hence, the first electronic board 30A and the second electronic board 40A are prevented from being deformed.

Further, the internal space of the die is uniformly filled with the heated and melted synthetic resin, which can realize a non-hollow structure.

Accordingly, the peel-off of solders from the outer circuit components 31, the inner circuit components 33, and the heat-generating components 32 and 42, and the separation between the members such as the first electronic board 30A, the second electronic board 40A, the support member 20A, and the exterior covering material 11 can be prevented from occurring due to the expansion and shrinkage of air with a change in environmental temperature during actual use.

Second Embodiment

Figure 5A:
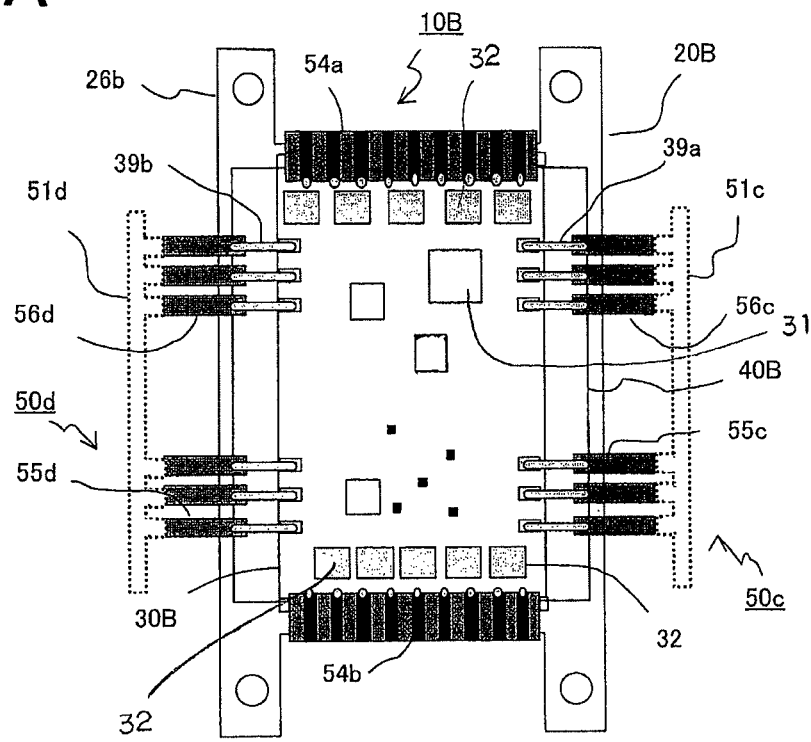
FIG. 5A is a top view illustrating an electronic control device according to a second embodiment of the present invention before the electronic control device is sealed with a resin.
Figure 5B:
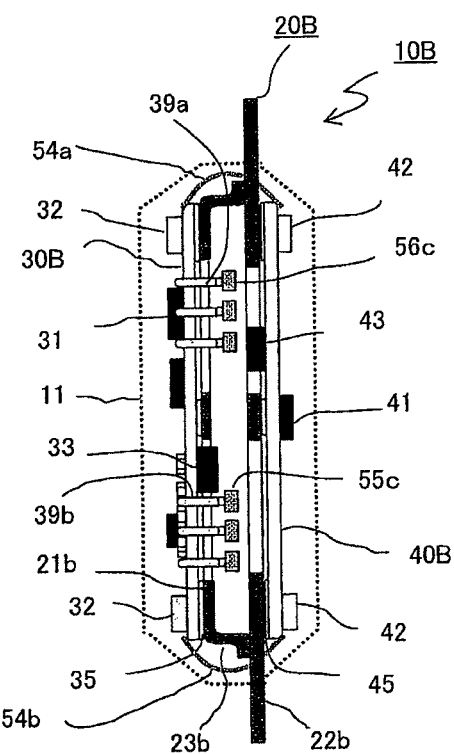
FIG. 5B is a right side view of FIG. 5A.
Figure 6A:
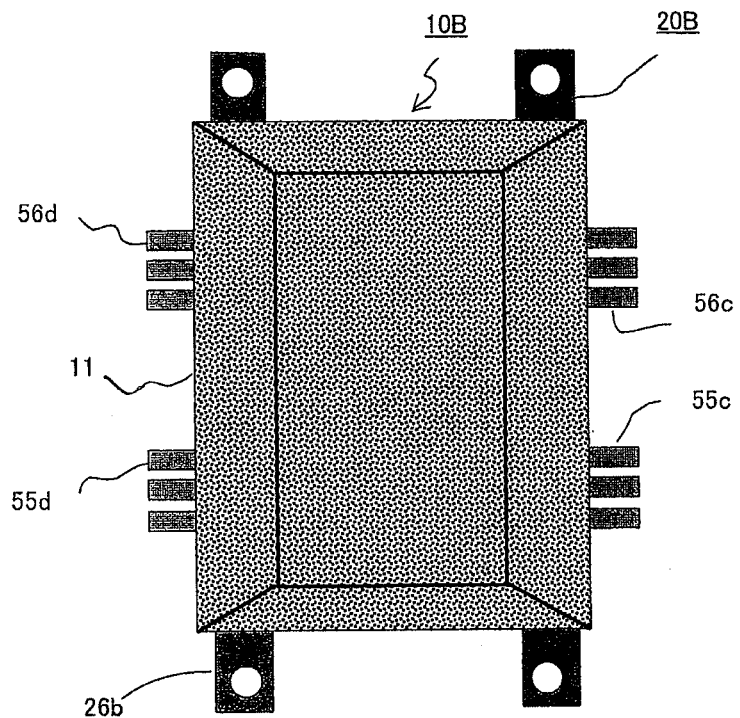
FIG. 6A is a top view illustrating the electronic control device illustrated in FIGS. 5A and 5B after the electronic control device is sealed with the resin.
Figure 6B:
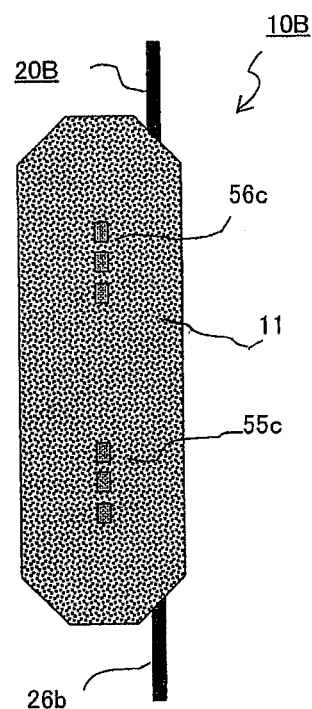
FIG. 6B is a right side view of FIG. 6A.
Figure 7A:
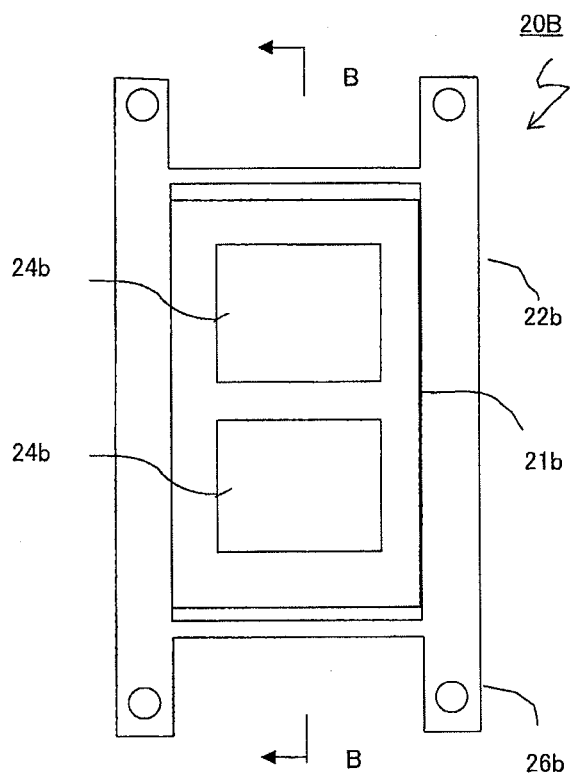
FIG. 7A is a top view illustrating a support member illustrated in FIGS. 5A and 5B.
Figure 7B:
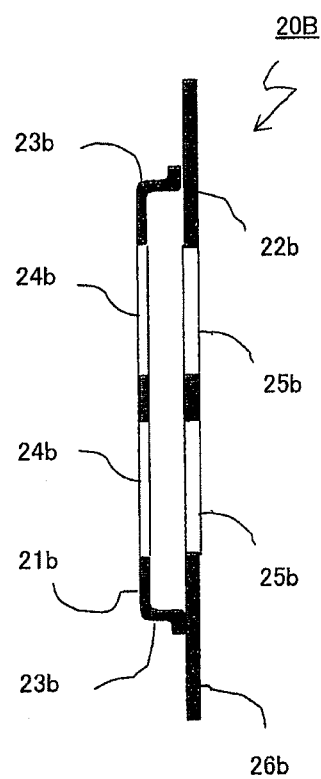
FIG. 7B is a sectional view taken along the line B-B of FIG. 7A.

FIG. 5A is a top view illustrating an electronic control device 10B according to a second embodiment of the present invention before the electronic control device 10B is sealed with a resin, whereas FIG. 5B is a right side view of FIG. 5A. FIG. 6A is a top view illustrating the electronic control device 10B illustrated in FIGS. 5A and 5B after the electronic control device 10B is sealed with the resin, whereas FIG. 6B is a right side view of FIG. 6A. FIG. 7A is a top view illustrating a support member 20B illustrated in FIGS. 5A and 5B, whereas FIG. 7B is a sectional view taken along the line B-B of FIG. 7A.

The electronic control device 10B is a transmission control device for an automobile transmission and includes the support member 20B, a first electronic board 30B, a second electronic board 40B, and a large number of external connection terminals 55c, 55d, 56c, and 56d. The support member 20B includes a first support plate 21b and a second support plate 22b. The first electronic board 30B is bonded to be fixed to an upper surface of the support member 20B by the adhesive 35, whereas the second electronic board 40B is bonded to be fixed to a lower surface of the support member 20B by the adhesive 45. The first electronic board 30B and the second electronic board 40B are electrically connected to each other through an intermediation of flexible boards 54a and 54b. The large number of external connection terminals 55c, 55d, 56c, and 56d are electrically connected to the first electronic board 30B through an intermediation of the bonding wires 39a and 39b.

The electronic control device 10B further includes the outer circuit components 31, the heat-generating components 32, the inner circuit components 33, the outer circuit components 41, the heat-generating components 42, the inner circuit components 43, and the exterior covering material 11. The outer circuit components 31 and the heat-generating components 32 are mounted on an outer mounting surface of the first electronic board 30B, whereas the inner circuit components 33 are mounted on an inner mounting surface of the first electronic board 30B. The outer circuit components 41 and the heat-generating components 42 are mounted on an outer mounting surface of the second electronic board 40B, whereas the inner circuit components 43 are mounted on an inner mounting surface of the second electronic board 40B. The exterior covering material 11 is made of a thermosetting resin and covers all of the first electronic board 30B, the second electronic board 40B, the bonding wires 39a and 39b, the flexible boards 54a and 54b, the outer circuit components 31 and 41, the inner circuit components 33 and 43, and the heat-generating components 32 and 42. The exterior covering material 11 also covers the support member 20B, and the external connection terminals 55c, 55d, 56c, and 56d so that the support member 20B, and the external connection terminals 55c, 55d, 56c, and 56d are partially exposed therefrom.

The first support plate 21b corresponding to a first support portion of the support member 20B has a pair of window holes 24b formed in the center. Moreover, rising portions 23b corresponding to a pair of spacer portions are formed on both lateral sides of the first support plate 21b having a rectangular shape. Each of the rising portions 23b is formed so as to be bent and to rise in an L shape. By the pair of rising portions 23b, the first electronic board 30B and the second electronic board 40B are kept at a distance from each other.

The second support plate 22b corresponding to a second support portion of the support member 20B has a pair of window holes 25b formed in the center. Moreover, mounting feet 26b are formed at four corners of the second support plate 22b having a rectangular shape so as to project along the longitudinal direction to be exposed from the exterior covering material 11.

The first support plate 21b and the second support plate 22b, each being made of, for example, a highly thermally conductive sheet metal material, are integrated with each other by welding, brazing, or bonding.

Both lateral sides (first edges extending along the rising portions 23b) of the rectangular first electronic board 30B made of, for example, glass epoxy, are bonded and fixed onto a heat-transfer surface of the first support plate 21b by the adhesive 35. The adhesive 35 is, for example, the thermosetting silicon resin composition.

Similarly to the outer circuit components 31, the plurality of heat-generating components 32 are arranged on the outer mounting surface of the first electronic board 30B. The heat-generating components 32 are arranged at intervals in areas of the first electronic board 30B along both the lateral sides, the areas being in positions vertically corresponding to the first support plate 21b.

The inner circuit components 33 mounted on the inner mounting surface of the first electronic board 30B are situated inside the window holes 24b of the first support plate 21b. The height size of each of the inner circuit components 33 is determined so that the inner circuit components 33 do not abut at least against the inner mounting surface of the second electronic board 40B, specifically, the height size of each of the inner circuit components 33 is smaller than a height size of each of the rising portions 23b.

Both lateral sides (first edges extending along the rising portions 23b) of the rectangular second electronic board 40B made of, for example, glass epoxy, are bonded and fixed onto a heat-transfer surface of the second support plate 22b by the adhesive 45. The adhesive 45 is, for example, the thermosetting silicon resin composition. Similarly to the outer circuit components 41, the plurality of heat-generating components 42 are provided on the outer mounting surface of the second electronic board 40B. The heat-generating components 42 are arranged at intervals in areas of the second electronic board 40B along both the lateral sides, the areas being in positions vertically corresponding to the second support plate 22b.

The inner circuit components 43 mounted on the inner mounting surface of the second electronic board 40B are situated inside the window holes 25b of the second support plate 22b. A height size of each of the inner circuit components 43 is determined so that the inner circuit components 43 do not abut at least against the inner mounting surface of the first electronic board 30B, specifically, the height size of each of the inner circuit components 43 is smaller than the height size of each of the rising portions 23b.

A plurality of connection lands are provided in areas of the outer mounting surface of the first electronic board 30B along both the lateral sides. Similarly, a plurality of connection lands are provided in areas of the outer mounting surface of the second electronic board 40B along both the lateral sides. The connection lands of the first electronic board 30B and the connection lands of the second electronic board 40B are connected to each other respectively by the flexible substrates 54a and 54b, and hence, the first electronic board 30B and the second electronic board 40B are electrically connected to each other.

A plurality of connection lands are provided in areas of the outer mounting surface of the first electronic board 30B along both longitudinal sides (second edges extending between the pair of rising portions 23b which are opposed to each other). The connection lands are electrically connected to the large number of external connection terminals 55c, 55d, 56c, and 56d by the bonding wires 39a and 39b, each of which is, for example, a thin aluminum wire.

The external connection terminals 55c, 55d, 56c, and 56d are separated into two groups in the longitudinal direction of the first electronic board 30B. A first group includes the external connection terminals 55c and 55d, whereas a second group includes the external connection terminals 56c and 56d.

The large number of external connection terminals 55c, 55d, 56c, and 56d each have a distal end which extends vertically with respect to both of the second edges of the first electronic board 30B. Until the last step of assembly, the external connection terminals 55c and 56c are elements constituting a group terminal plate 50c, whereas the external connection terminals 55d and 56d are elements constituting a group terminal plate 50d. By cutting cutout connection portions 51c and 51d in the last step of assembly, the large number of external connection terminals 55c, 55d, 56c, and 56d are separated into individual pieces.

The large number of external connection terminals 55c, 55d, 56c, and 56d may alternatively be electrically connected to the second electronic board 40B instead of being connected to the first electronic board 30B.

Figure 8:
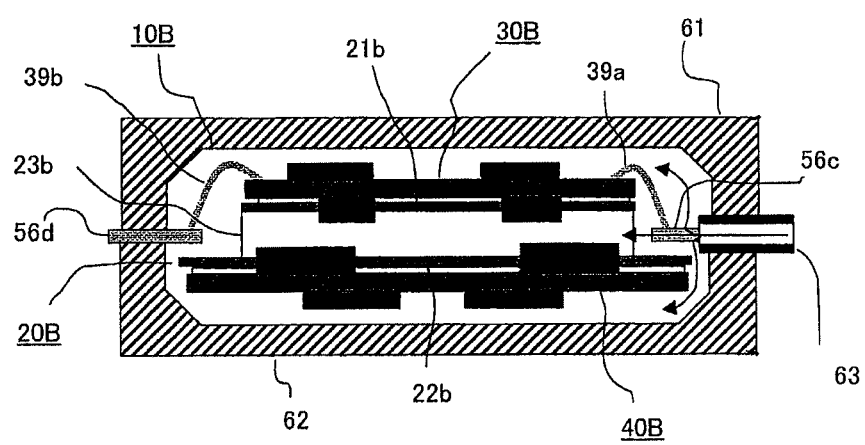
FIG. 8 is a sectional view of a molding die used for the fabrication of the electronic control device illustrated in FIG. 5.

FIG. 8 is a sectional view of a molding die used for the fabrication of the electronic control device 10B illustrated in FIGS. 5A and 5B.

Inside the molding die constituted by the upper die 61 and the lower die 62, the electronic control device 10B (illustrated in FIGS. 5A and 5B) before being molded with the resin is placed. Specifically, in the electronic control device 10B, the external connection terminals 55c, 55d, 56c, and 56d are connected to the first electronic board 30B through an intermediation of the bonding wires 39a and 39b, as illustrated in FIGS. 5A and 5B.

The resin injection port 63 is provided to the molding die at a position between the first group and the second group of the external connection terminals in the longitudinal direction, on the side where the bonding wires 39a are provided.

A thermosetting resin, which is heated and melted, is injected under pressure through the resin injection port 63 into the space closed by the upper die 61 and the lower die 62. The thermosetting resin is, for example, an epoxy resin composition.

A flow of the synthetic resin injected through the resin injection port 63 under pressure is split into three streams, as indicated by arrows of FIG. 8. A first stream flows into an upper space on the outer mounting surface of the first electronic board 30B, a second stream flows into a space surrounded by the first electronic board 30B, the second electronic board 40B, and the pair of rising portions 23b, and a third stream flows into a lower space under the outer mounting surface of the second electronic board 40B. Then, the three streams join together downstream, that is, on the side where the bonding wires 39b are provided.

The thermosetting resin has a characteristic of not being softened or melted by re-heating once cured after heating and melting. Therefore, the gel-like adhesive 35, which is the thermosetting resin composition for bonding the support member 20B and the first electronic board 30B to each other, and the gel-like adhesive 45, which is the thermosetting resin composition for bonding the support member 20B and the second electronic board 40B to each other, are not softened at the time of heat-molding of the exterior covering material 11 by being thermally cured after the application and the bonding.

A thermoplastic resin may alternatively be used as the exterior covering material 11. If the thermoplastic resin is used, the exterior covering material 11 is melted by re-heating. Therefore, the components included in the electronic control device 10B can be collected separately after the use.

As described above, according to the electronic control device 10B of this second embodiment, the support member 20B includes the first support plate 21b and the second support plate 22b. The first support plate 21b is made of the rectangular sheet metal material and has the rising ends on both sides as the pair of rising portions 23b, whereas the second support plate 22b is the flat plate made of the rectangular sheet metal material, which is fixedly bonded to the ends of the rising portions 23b. The first electronic board 30B having the outer mounting surface on which the outer circuit components 31 are mounted and the inner mounting surface on which the inner circuit components 33 are mounted is bonded to the first support plate 21b having the window holes 24b, whereas the second electronic board 40B having the outer mounting surface on which the outer circuit components 41 are mounted and the inner mounting surface on which the inner circuit components 43 are mounted is bonded to the second support plate 22b having the window holes 25b.

Therefore, the support member 20B supports the first electronic board 30B and the second electronic board 40B, each having two surfaces on both of which the components are mounted, at a distance from each other. Thus, the areas on which the circuit components 31, 33, 41, and 43 are mounted can be increased without increasing a plane area of each of the electronic boards. As a result, a plane area and a volume of the entire electronic control device 10B can be prevented from being increased.

Moreover, the support member 20B is made of the highly thermally conductive sheet metal material. Therefore, heat-radiation efficiency for the heat-generating components 32 and 42 corresponding to the outer circuit components is high. In addition, the heat-generating components 32 and 42 are provided in a region which is in the position vertically corresponding to the support member 20B. Specifically, the support member 20B is provided so as to be held in contact with the inner mounting surface of the first electronic board 30B carrying the heat-generating components 32 on the outer mounting surface and with the inner mounting surface of the second electronic board 40B carrying the heat-generating components 42 on the outer mounting surface.

Therefore, the heat-generating components 32 and the heat-generating components 42 are not mounted on both surfaces of the first electronic board 30B and the second electronic board 40B, respectively, at the positions vertically corresponding to each other. Thus, the heat generated from the heat-generating components 32 and 42 is efficiently radiated through an intermediation of the support member 20B. As a result, a temperature can be prevented from being locally excessively high.

Moreover, the external connection terminals 55c, 55d, 56c, and 56d, each having the distal end extending along the rising portions 23b, are grouped into the first group and the second group so that the first group and the second group are arranged at a distance from each other along the second edges. Moreover, the resin injection port 63 of the die is formed between the first group and the second group in the longitudinal direction so as to be oriented to the space portion surrounded by the first electronic board 30B, the second electronic board 40B, and the pair of rising portions 23b.

The heated and melted synthetic resin is injected under pressure into the die through the resin injection port 63. Thus, the external connection terminals 55c, 55d, 56c, and 56d do not interfere with the injection of the synthetic resin under pressure. Thus, the structure of the die is correspondingly simplified.

Moreover, the plurality of board-to-board connection lands are provided at intervals in areas of the first electronic board 30B and the second electronic board 40B along the first edges which extend along the rising portions 23b corresponding to the spacer portions. The ends of each of the flexible boards 54a and 54b are respectively connected to the board-to-board connection lands provided to the first electronic board 30B and those provided to the second electronic board 40B. In this manner, the first electronic board 30B and the second electronic board 40B are electrically connected to each other.

Thus, the space between the external connection terminals 55c and 55d constituting the first group and the external connection terminals 56c and 56d constituting the second group can be minimized so as to be sufficient for the resin injection port 63 to be oriented to. An overall size of the electronic control device 10B can be correspondingly reduced.

It is apparent that bonding wires may also be used to electrically connect the first electronic board 30B and the second electronic board 40B to each other in place of the flexible boards 54a and 54b.

In the case where the bonding wires are used, even if the first electronic board 30B and the second electronic board 40B are electrically connected to each other at the second edges extending vertically with respect to the first edges, the heated and melted synthetic resin can pass through the interspaces between the adjacent bonding wires. Specifically, the first electronic board 30B and the second electronic board 40B can also be electrically connected to each other at the second edges by using the bonding wires.

In this case, a distance between the first group including the external connection terminals 55c and 55d and the second group including the external connection terminals 56c and 56d is increased. However, the wirings for electrical connection are not required to be provided to the first edges of the first electronic board 30B and the second electronic board 40B. Thus, a size of each of the first edges can be reduced, and hence, the overall size of the electronic control device 10B can suit to a size of a target to which the electronic control device 10B is mounted.

Further, the first electronic board 30B and the second electronic board 40B are previously bonded to the support member 20B by curing the adhesives 35 and 45 with heating. Then, the external connection terminals 55c, 55d, 56c, and 56d are electrically connected to the first electronic board 30B through an intermediation of the bonding wires 39a and 39b. The first electronic board 30B and the second electronic board 40B are electrically connected through an intermediation of the flexible boards 54a and 54b to fabricate the unmolded body. After the fabrication of the unmolded body in the manner described above, the unmolded body is placed inside the die. Then, the heated and melted synthetic resin is injected under pressure into the die along the rising portions 23b to form the exterior covering material 11 by molding.

Therefore, the adhesives 35 and 45, each being the thermosetting resin, are not melted or softened by the heat of the melt synthetic resin at the time of pressure-molding. Therefore, all the components are reliably integrated.

Further, the synthetic resin, which is injected under pressure, is split inside the die into the three streams flowing in the three directions, that is, into the space portion, into the upper space above the first electronic board 30B, and into the lower space below the second electronic board 40B. Therefore, the pressure is distributed at the time of the injection of the synthetic resin under pressure, and hence, the first electronic board 30B and the second electronic board 40B are prevented from being deformed.

Further, the internal space of the die is uniformly filled with the heated and melted synthetic resin, which can realize a non-hollow structure.

Accordingly, the peel-off of the solders from the outer circuit components 31, the inner circuit components 33, and the heat-generating components 32 and 42, and the separation between the members such as the first electronic board 30B, the second electronic board 40B, the support member 20B, and the exterior covering material 11 can be prevented from occurring due to the expansion and shrinkage of air with a change in environmental temperature during actual use.

Third Embodiment

Figure 9A:
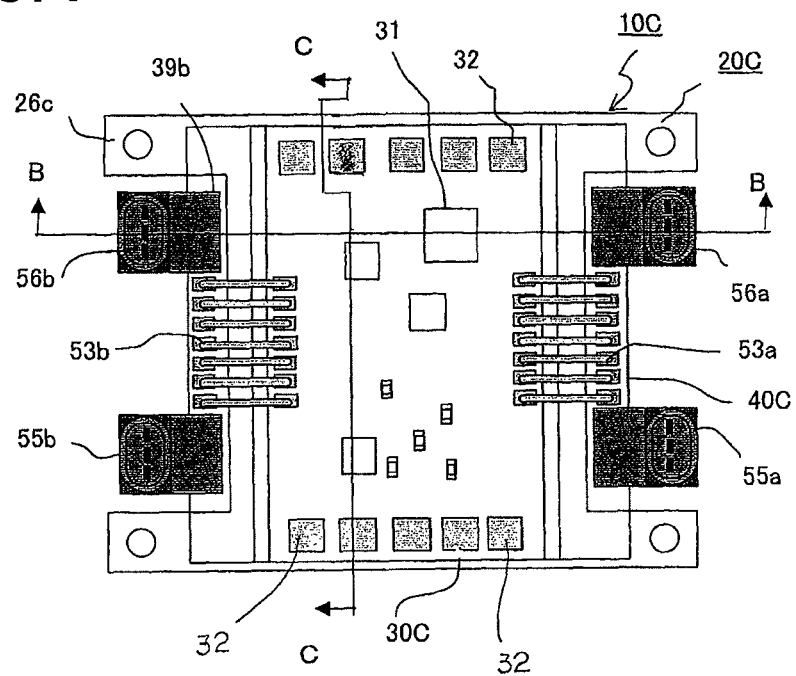
FIG. 9A is a top view illustrating an electronic control device according to a third embodiment of the present invention before the electronic control device is sealed with a resin.
Figure 9B:
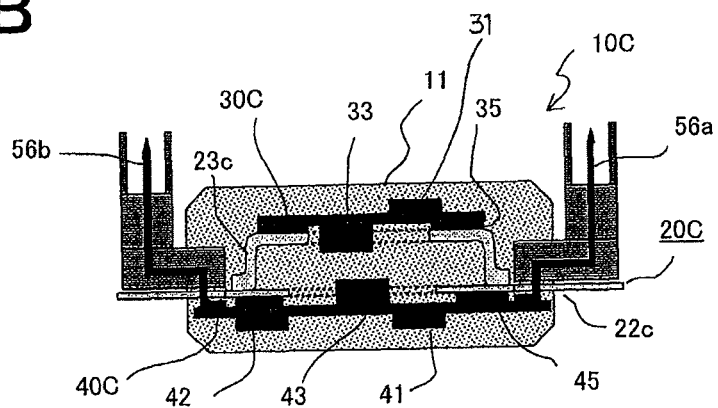
FIG. 9B is a sectional view taken along the line B-B of FIG. 9A.
Figure 10:
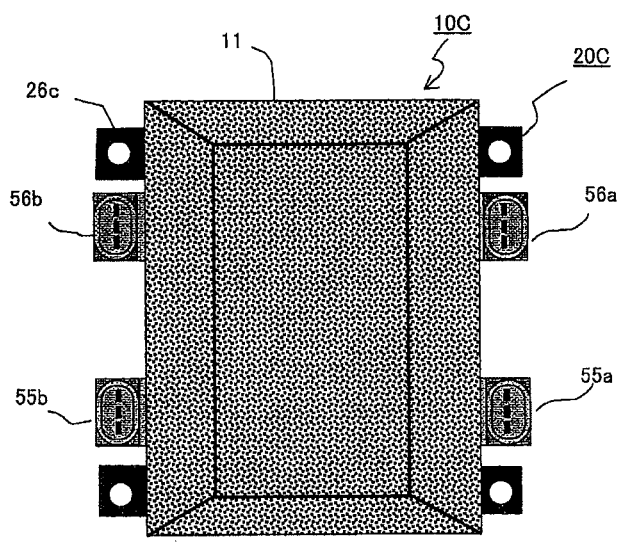
FIG. 10 is a top view illustrating the electronic control device illustrated in FIGS. 9A and 9B after the electronic control device is sealed with the resin.
Figure 11A:
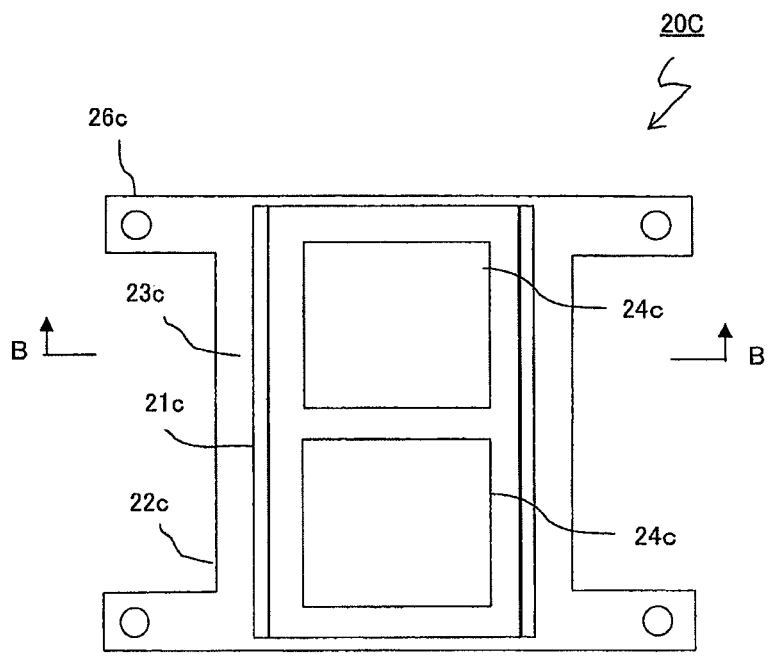
FIG. 11A is a top view illustrating a support member illustrated in FIGS. 9A and 9B.
Figure 11B:
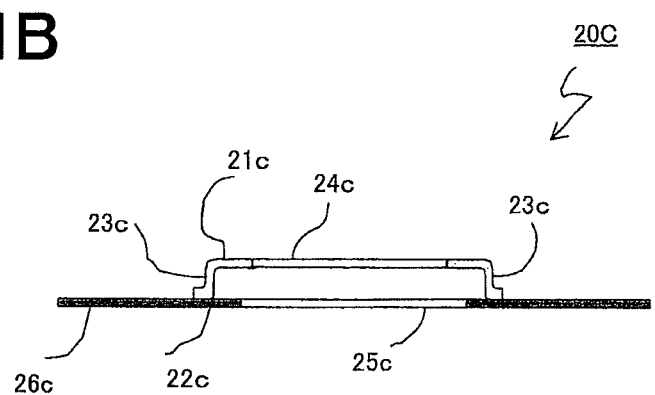
FIG. 11B is a sectional view taken along the line B-B of FIG. 11A.

FIG. 9A is a top view illustrating an electronic control device 10C according to a third embodiment of the present invention before the electronic control device 10C is sealed with a resin, whereas FIG. 9B is a sectional view taken along the line B-B of FIG. 9A. FIG. 10 is a top view illustrating the electronic control device 10C illustrated in FIGS. 9A and 9B after the electronic control device 10C is sealed with the resin. FIG. 11A is a top view illustrating a support member 20C illustrated in FIGS. 9A and 9B, whereas FIG. 11B is a sectional view taken along the line B-B of FIG. 11A.

The electronic control device 10C is a transmission control device for an automobile transmission and includes the support member 20C, a first electronic board 30C, a second electronic board 40C, and a large number of external connection terminals 55a, 55b, 56a, and 56b. The support member 20C includes a first support plate 21c and a second support plate 22c. The first electronic board 30C is bonded to be fixed to an upper surface of the support member 20C by the adhesive 35, whereas the second electronic board 40C is bonded to be fixed to a lower surface of the support member 20C by the adhesive 45. The first electronic board 30C and the second electronic board 40C are electrically connected to each other through an intermediation of the bonding wires 53a and 53b. The large number of external connection terminals 55a, 55b, 56a, and 56b are electrically connected to the second electronic board 40C.

The electronic control device 10C further includes the outer circuit components 31, the heat-generating components 32, the inner circuit components 33, the outer circuit components 41, the heat-generating components 42, the inner circuit components 43, and the exterior covering material 11. The outer circuit components 31 and the heat-generating components 32 are mounted on an outer mounting surface of the first electronic board 30C, whereas the inner circuit components 33 are mounted on an inner mounting surface of the first electronic board 30C. The outer circuit components 41 and the heat-generating components 42 are mounted on an outer mounting surface of the second electronic board 40C, whereas the inner circuit components 43 are mounted on an inner mounting surface of the second electronic board 40C. The exterior covering material 11 is made of a thermosetting resin and covers all of the first electronic board 30C, the second electronic board 40C, the bonding wires 53a and 53b, the outer circuit components 31 and 41, the inner circuit components 33 and 43, and the heat-generating components 32 and 42. The exterior covering material 11 also covers the support member 20C, and the external connection terminals 55a, 55b, 56a, and 56b so that the support member 20B, and the external connection terminals 55a, 55b, 56a, and 56b are partially exposed therefrom.

The first support plate 21c corresponding to a first support portion of the support member 20C has a pair of window holes 24c formed in the center. Moreover, rising portions 23c corresponding to a pair of spacer portions are formed on both longitudinal sides of the first support plate 21c having a rectangular shape. Each of the rising portions 23c is formed so as to be bent and to rise in an L shape. By the pair of rising portions 23c, the first electronic board 30C and the second electronic board 40C are kept at a distance from each other.

The second support plate 22c corresponding to a second support portion of the support member 20C has a pair of window holes 25c formed in the center. Moreover, mounting feet 26c are formed at four corners of lateral sides of the second support plate 22c having a rectangular shape so as to project along the lateral direction to be exposed from the exterior covering material 11.

The first support plate 21c and the second support plate 22c, each being made of, for example, a highly thermally conductive sheet metal material, are integrated with each other by welding, brazing, or bonding.

Both longitudinal sides (first edges extending along the pair of rising portions 23c which are opposed to each other) of the rectangular first electronic board 30C made of, for example, glass epoxy, are bonded and fixed onto a heat-transfer surface of the first support plate 21c by the adhesive 35. The adhesive 35 is, for example, the thermosetting silicon resin composition. Similarly to the outer circuit components 31, the plurality of heat-generating components 32 are arranged on the outer mounting surface of the first electronic board 30C. The heat-generating components 32 are arranged at intervals in areas of the second edges orthogonal to the first edges of the first electronic board 30C, the areas being in positions vertically corresponding to the first support plate 21c.

The inner circuit components 33 mounted on the inner mounting surface of the first electronic board 30C are situated inside the window holes 24c of the first support plate 21c. The height size of each of the inner circuit components 33 is determined so that the inner circuit components 33 do not abut at least against the inner mounting surface of the second electronic board 40C, specifically, the height size of each of the inner circuit components 33 is smaller than a height size of each of the rising portions 23c.

Both longitudinal sides (first edges extending along the pair of rising portions 23c which are opposed to each other) of the rectangular second electronic board 40C made of, for example, glass epoxy, are bonded and fixed onto a heat-transfer surface of the second support plate 22b by the adhesive 45. The adhesive 45 is, for example, the thermosetting silicon resin composition. Similarly to the outer circuit components 41, the plurality of heat-generating components 42 are provided on the outer mounting surface of the second electronic board 40C. The heat-generating components 42 are arranged at intervals in areas of the second edges orthogonal to the first edges of the second electronic board 40C, the areas being in positions vertically corresponding to the second support plate 22c.

The inner circuit components 43 mounted on the inner mounting surface of the second electronic board 40C are situated inside the window holes 25c of the second support plate 22c. A height size of each of the inner circuit components 43 is determined so that the inner circuit components 43 do not abut at least against the inner mounting surface of the first electronic board 30C, specifically, the height size of each of the inner circuit components 43 is smaller than the height size of each of the rising portions 23c.

A plurality of connection lands are provided in a middle portion of each of areas of the outer mounting surface of the first electronic board 30C along both the longitudinal sides (first edges extending along the rising portions 23c). A plurality of connection lands are also provided in a middle portion of each of areas of the inner mounting surface of the second electronic board 40C along both the longitudinal sides (first edges extending along the rising portions 23c). The connection lands of the first electronic board 30C and the connection lands of the second electronic board 40C are connected to each other by the bonding wires 53a and 53b. In this manner, the first electronic board 30C and the second electronic board 40C are electrically connected to each other.

A plurality of connection lands are provided in areas of the inner mounting surface of the second electronic board 40C along both the first edges. The connection lands are electrically connected to the large number of external connection terminals 55a, 55b, 56a, and 56b which are previously integrally molded with a thermosetting resin.

The external connection terminals 55a, 55b, 56a, and 56b are separated into a first group including the external connection terminals 55a and 55b and a second group including the external connection terminals 56a and 56b in the longitudinal direction of the second electronic board 40C.

The large number of external connection terminals 55a, 55b, 56a, and 56b may be electrically connected to the first electronic board 30C instead of being connected to the second electronic board 40C.

Figure 12:
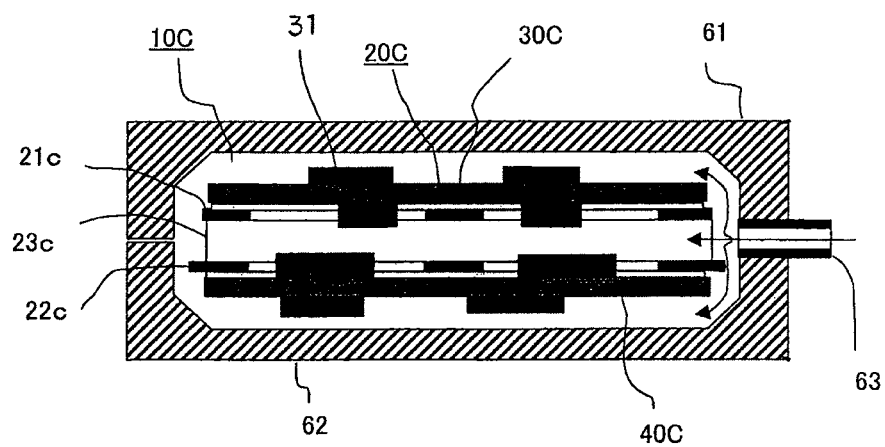
FIG. 12 is a sectional view of a molding die used for the fabrication of the electronic control device illustrated in FIG. 9.

FIG. 12 is a sectional view of a molding die used for the fabrication of the electronic control device 10C illustrated in FIGS. 9A and 9B and is taken along the line C-C of FIG. 9A.

Inside the molding die constituted by the upper die 61 and the lower die 62, the electronic control device 100 before being molded with the resin is placed. In the electronic control device 10C before being molded with the resin, the external connection terminals 55a, 55b, 56a, and 56b are connected to the second electronic board 40C.

The resin injection port 63 is provided to the molding die so as to be oriented along the longitudinal direction of the rectangular first electronic board 30C.

A thermosetting resin, which is heated and melted, is injected under pressure through the resin injection port 63 into the space closed by the upper die 61 and the lower die 62. The thermosetting resin is, for example, an epoxy resin composition.

A flow of the synthetic resin injected through the resin injection port 63 under pressure is split into three streams, as indicated by arrows of FIG. 12. A first stream flows into an upper space on the outer mounting surface of the first electronic board 30C, a second stream flows into an internal space surrounded by the first electronic board 30C, the second electronic board 40C, and the pair of rising portions 23c, and a third stream flows into a lower space under the outer mounting surface of the second electronic board 40C. Then, the three streams join together downstream.

The thermosetting resin has a characteristic of not being softened or melted by re-heating once cured after heating and melting. Therefore, the gel-like adhesive 35 and the gel-like adhesive 45, which are the thermosetting resin composition, are not softened at the time of heat-molding of the exterior covering material 11 by being thermally cured after the application and the bonding.

A thermoplastic resin may alternatively be used as the exterior covering material 11. If the thermoplastic resin is used, the exterior covering material 11 is melted by re-heating. Therefore, the components included in the electronic control device 10C can be collected separately after the use.

As described above, according to the electronic control device 10C of this third embodiment, the support member 20C includes the first support plate 21c and the second support plate 22c. The first support plate 21c is made of the rectangular sheet metal material and has the rising ends on both sides as the rising portions 23c, whereas the second support plate 22c is the flat plate made of the rectangular sheet metal material, which is fixedly bonded to the ends of the rising portions 23c. The first electronic board 30C having the outer mounting surface on which the outer circuit components 31 are mounted and the inner mounting surface on which the inner circuit components 33 are mounted is bonded to the first support plate 21c having the window holes 24c, whereas the second electronic board 40C having the outer mounting surface on which the outer circuit components 41 are mounted and the inner mounting surface on which the inner circuit components 43 are mounted is bonded to the second support plate 22c having the window holes 25c.

Therefore, the support member 20C supports the first electronic board 30C and the second electronic board 40C, each having two surfaces on both of which the components are mounted, at a distance from each other. Thus, the areas on which the circuit components 31, 33, 41, and 43 are mounted can be increased without increasing a plane area of each of the electronic boards. As a result, a plane area and a volume of the entire electronic control device 10C can be prevented from being increased.

Moreover, the support member 20C is made of the highly thermally conductive sheet metal material. Therefore, heat-radiation efficiency for the heat-generating components 32 and 42 corresponding to the outer circuit components is high. In addition, the heat-generating components 32 and 42 are provided in a region which is in the position vertically corresponding to the support member 20C. Specifically, the support member 20C is provided so as to be held in contact with the inner mounting surface of the first electronic board 30C carrying the heat-generating components 32 on the outer mounting surface and with the inner mounting surface of the second electronic board 40C carrying the heat-generating components 42 on the outer mounting surface.

Therefore, the heat-generating components 32 and the heat-generating components 42 are not mounted on both surfaces of the first electronic board 30C and the second electronic board 40C at the positions vertically corresponding to each other. Thus, the heat generated from the heat-generating components 32 and 42 is efficiently radiated through an intermediation of the support member 20C. As a result, a temperature can be prevented from being locally excessively high.

The external connection terminals 55a, 55b, 56a, and 56b, each having the distal end portion extending vertically with respect to the first edges, are provided so that the first group and the second group are separated from each other along the first edges. Moreover, the bonding wires 53a and 53b, which electrically connect the first electronic board 30C and the second electronic board 40C to each other, are provided between the first group including the external connection terminals 55a and 55b and the second group including the external connection terminals 56a and 56b.

Therefore, in this electronic control device 10C, the external connection terminals 55a, 55b, 56a, and 56b and the bonding wires 53a and 53b are not present on the side where the resin injection port 63 is provided. Therefore, the structure of the molding die is correspondingly simplified.

Moreover, wirings for electrical connection are not required to be provided in the areas of the first electronic board 30C and the second electronic board 40C along the second edges which extend vertically with respect to the first edges extending along the rising portions 23c. Thus, a length size of each of the second edges can be reduced, and hence, the overall size of the electronic control device 10C can suit a size of a target to which the electronic control device 10C is mounted.

Further, the first electronic board 30C and the second electronic board 40C may alternatively be electrically connected at the second edges by using the bonding wires 53a and 53b.

In this case, the adjacent bonding wires 53a and 53b are provided on the side where the resin injection port 63 is provided and on the opposite side thereof, respectively. The heated and melted synthetic resin passes through the interspaces between the bonding wires 53a and 53b to be injected into the internal space of the die.

Moreover, the areas where the connection wires are provided are separately provided on the side of the first edges of the first electronic board 30C and the second electronic board 40C and on the side of the second edges of the first electronic board 30C and the second electronic board 40C. Therefore, the overall size of the electronic control device 10C can be reduced.

Further, the first electronic board 30C and the second electronic board 40C are previously bonded to the support member 20C by curing the adhesives 35 and 45 with heating. Then, the external connection terminals 55a, 55b, 56a, and 56b are electrically connected to the second electronic board 40C. The first electronic board 30C and the second electronic board 40C are electrically connected through an intermediation of the bonding wires 53a and 53b to fabricate the unmolded body. After the fabrication of the unmolded body in the manner described above, the unmolded body is placed inside the die. Then, the heated and melted synthetic resin is injected under pressure into the die along the rising portions 23c to form the exterior covering material 11 by molding.

Therefore, the adhesives 35 and 45, each being the thermosetting resin, are not melted or softened by the heat of the melt synthetic resin at the time of pressure-molding. Therefore, all the components are reliably integrated.

Further, the synthetic resin, which is injected under pressure, is split inside the die into the three streams flowing in the three directions, that is, into the space portion, into the upper space above the first electronic board 30C, and into the lower space below the second electronic board 40C. Therefore, the pressure is distributed at the time of the injection of the synthetic resin under pressure, and hence, the first electronic board 30C and the second electronic board 40C are prevented from being deformed.

Further, the internal space of the die is uniformly filled with the heated and melted synthetic resin, which can realize a non-hollow structure.

Accordingly, the peel-off of the solders from the outer circuit components 31, the inner circuit components 33, and the heat-generating components 32 and 42, and the separation between the members such as the first electronic board 30C, the second electronic board 40C, the support member 20C, and the exterior covering material 11 can be prevented from occurring due to the expansion and shrinkage of air with a change in environmental temperature during actual use.

Fourth Embodiment

Figure 13A:
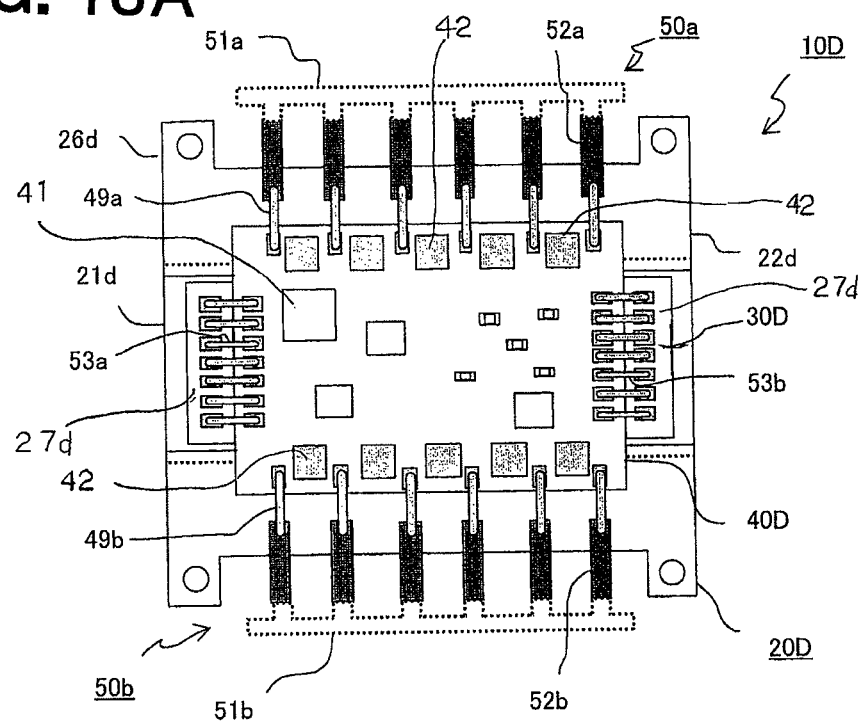
Figure 13B:
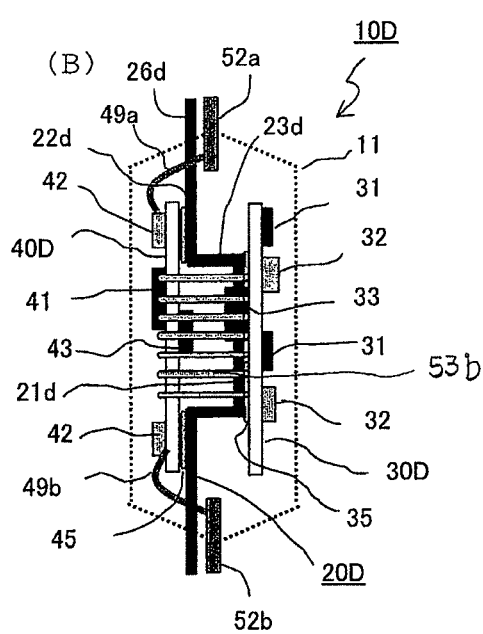
FIG. 13B is a right side view of FIG. 13A.
Figure 14A:
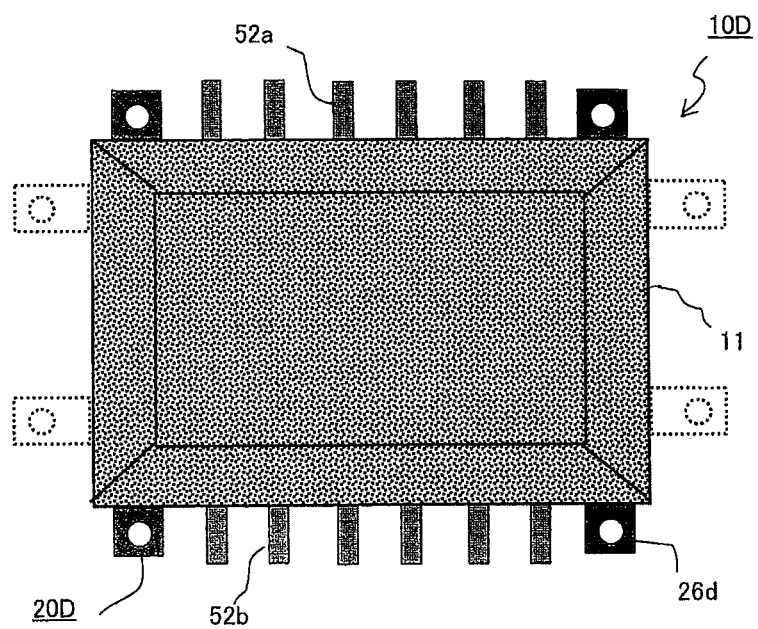
FIG. 14A is a top view illustrating the electronic control device illustrated in FIGS. 13A and 13B after the electronic control device is sealed with the resin.
Figure 14B:
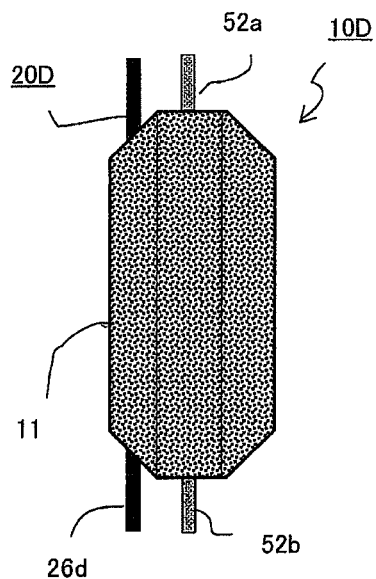
FIG. 14B is a right side view of FIG. 14A.
Figure 15A:
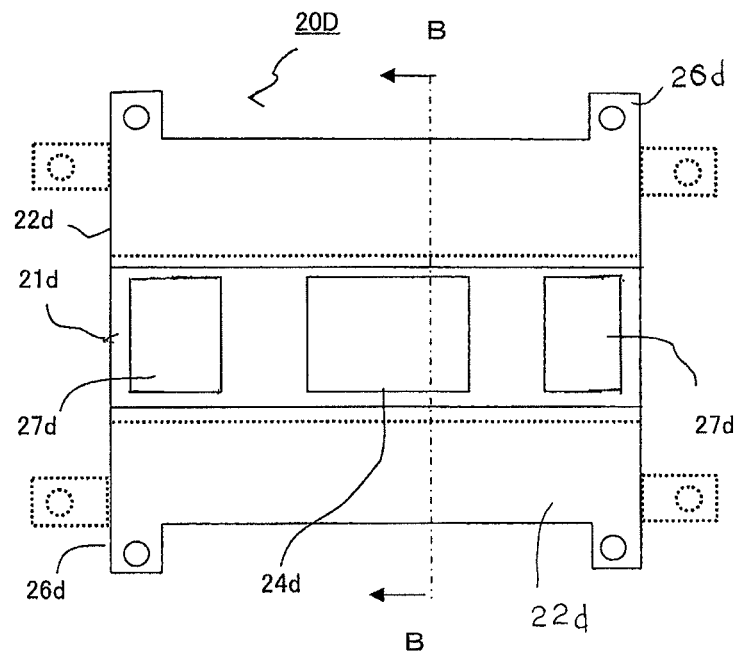
FIG. 15A is a top view illustrating a support member illustrated in FIGS. 13A and 13B.
Figure 15B:
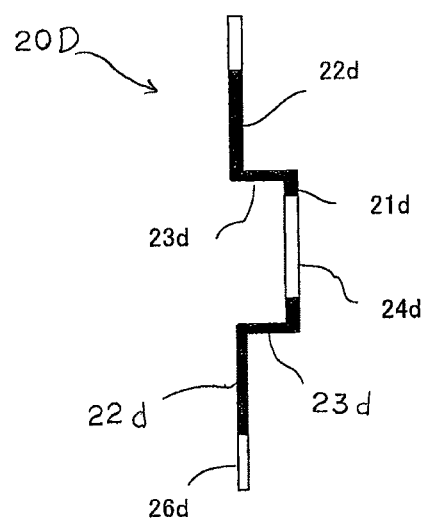
FIG. 15B is a sectional view taken along the line B-B of FIG. 15A.

FIG. 13A is a top view illustrating an electronic control device 10D according to a fourth embodiment of the present invention before the electronic control device 10D is sealed with a resin, whereas FIG. 13B is a right side view of FIG. 13A. FIG. 14A is a top view illustrating the electronic control device 10D illustrated in FIGS. 13A and 13B after the electronic control device 10D is sealed with the resin, whereas FIG. 14B is a right side view of FIG. 14A. FIG. 15A is a top view illustrating a support member 20D illustrated in FIGS. 13A and 13B, whereas FIG. 15B is a sectional view taken along the line B-B of FIG. 15A.

The electronic control device 10D is a transmission control device for an automobile transmission and includes the support member 20D, a first electronic board 30D, a second electronic board 40D, and the large number of external connection terminals 52a and 52b. The first electronic board 30D is bonded to be fixed to a lower surface of the support member 20D by the adhesive 35, whereas the second electronic board 40D is bonded to be fixed to an upper surface of the support member 20D by the adhesive 45. The first electronic board 30D and the second electronic board 40D are electrically connected to each other through an intermediation of the bonding wires 53a and 53b. The large number of external connection terminals 52a and 52b are electrically connected to the second electronic board 40D through an intermediation of bonding wires 49a and 49b.

The electronic control device 10D further includes the outer circuit components 31, the heat-generating components 32, the inner circuit components 33, the outer circuit components 41, the heat-generating components 42, the inner circuit components 43, and the exterior covering material 11. The outer circuit components 31 and the heat-generating components 32 are mounted on an outer mounting surface of the first electronic board 30D, whereas the inner circuit components 33 are mounted on an inner mounting surface of the first electronic board 30D. The outer circuit components 41 and the heat-generating components 42 are mounted on an outer mounting surface of the second electronic board 40D, whereas the inner circuit components 43 are mounted on an inner mounting surface of the second electronic board 40D. The exterior covering material 11 is made of a thermosetting resin and covers all of the first electronic board 30D, the second electronic board 40D, the bonding wires 49a and 49b, the outer circuit components 31 and 41, the inner circuit components 33 and 43, and the heat-generating components 32 and 42. The exterior covering material 11 also covers the support member 20D, and the external connection terminals 52a and 52b so that the support member 20D and the external connection terminals 52a and 52b are partially exposed therefrom.

The support member 20D is made of a highly thermally conductive sheet metal material having a rectangular shape as viewed in plane. The support member 20D has a middle portion which is bent to have a U-like cross section so as to form a depressed portion. The depressed portion has a bottom surface portion 21d corresponding to the first support portion. The support member 20D also has a pair of rising portions 23d which correspond to the spacer portions opposed to each other, and plane portions 22d corresponding to the second support portion obtained by bending ends of the rising portions 23d at a right angle so that the bent ends extend in opposite directions away from each other.

The bottom surface portion 21d has a window hole 24d formed in the center. Moreover, on both sides of the window hole 24d, a pair of wiring slits 27d for electrical connection between the first electronic board 30D and the second electronic board 40D are formed.

Mounting feet 26d are provided at two corners of each of the plane portions 22d, at four corners in total, so as to project outward along the lateral direction.

The pair of rising portions 23d, which are opposed to each other, keep the first electronic board 30D and the second electronic board 40D at a distance from each other.

The mounting feet 26d may alternatively be provided so as to project outward along the longitudinal direction of the plane portion 22d as indicated by dotted lines of FIG. 15A.

Both lateral sides (first edges extending along the rising portions 23d corresponding to the spacer portions) of the rectangular first electronic board 30D made of, for example, glass epoxy, are bonded and fixed onto a heat-transfer surface of the bottom surface portion 21d corresponding to the first support portion by the adhesive 35. The adhesive 35 is, for example, the thermosetting silicon resin composition. Similarly to the outer circuit components 31, the plurality of heat-generating components 32 are arranged on the outer mounting surface of the first electronic board 30D. The heat-generating components 32 are arranged at intervals in areas of the first electronic board 30D along the first edges, the areas being in positions vertically corresponding to the bottom surface portion 21d.

The inner circuit components 33 mounted on the inner mounting surface of the first electronic board 30D are situated inside the window holes 24d of the bottom surface portion 21d. The height size of each of the inner circuit components 33 is determined so that the inner circuit components 33 do not abut at least against the inner mounting surface of the second electronic board 40D, specifically, the height size of each of the inner circuit components 33 is smaller than a height size of each of the rising portions 23d corresponding to the spacer portions.

Both lateral sides (first edges extending along the rising portions 23d corresponding to the spacer portions) of the rectangular second electronic board 40D made of, for example, glass epoxy, are bonded and fixed onto a heat-transfer surface of the plane portion 22d corresponding to the second support portion by the adhesive 45. The adhesive 45 is, for example, the thermosetting silicon resin composition. Similarly to the outer circuit components 41, the plurality of heat-generating components 42 are provided on the outer mounting surface of the second electronic board 40D. The heat-generating components 42 are arranged at intervals in areas of the second electronic board 40D along the first edges, the areas being in positions vertically corresponding to the plane portion 22d corresponding to the second support portion.

The inner circuit components 43 mounted on the inner mounting surface of the second electronic board 40D are situated vertically corresponding to the bottom surface portion 21d. A height size of each of the inner circuit components 43 is smaller than at least a height size of each of the rising portions 23d.

A plurality of connection lands are provided in areas of the inner mounting surface of the first electronic board 30D along the lateral sides (second edges extending between the rising portions 23d opposed to each other). A plurality of connection lands are also provided in areas of the outer mounting surface of the second electronic board 40D along the lateral sides (second edges extending between the rising portions 23d opposed to each other). The connection lands of the first electronic board 30D and the connection lands of the second electronic board 40D are connected to each other by the bonding wires 53a and 53b, each of which is, for example, a thin aluminum wire. In this manner, the first electronic board 30D and the second electronic board 40D are electrically connected to each other.

A plurality of connection lands are provided in areas of the outer mounting surface of the second electronic board 40D along both longitudinal sides (first edges extending between the rising portions 23d). The connection lands are electrically connected to the large number of external connection terminals 52a and 52b by the bonding wires 49a and 49b, each of which is, for example, a thin aluminum wire.

Until the last step of assembly, the large number of external connection terminals 52a and 52b each having the distal end extending vertically with respect to the first edges of the second electronic board 40D are elements constituting group terminal plates 50a and 50b. By cutting cutout connection portions 51a and 51b in the last step of assembly, the large number of external connection terminals 52a and 52b are separated into individual pieces.

The large number of external connection terminals 52a and 52b may alternatively be electrically connected to the first electronic board 30D instead of being connected to the second electronic board 40D.

Figure 16:
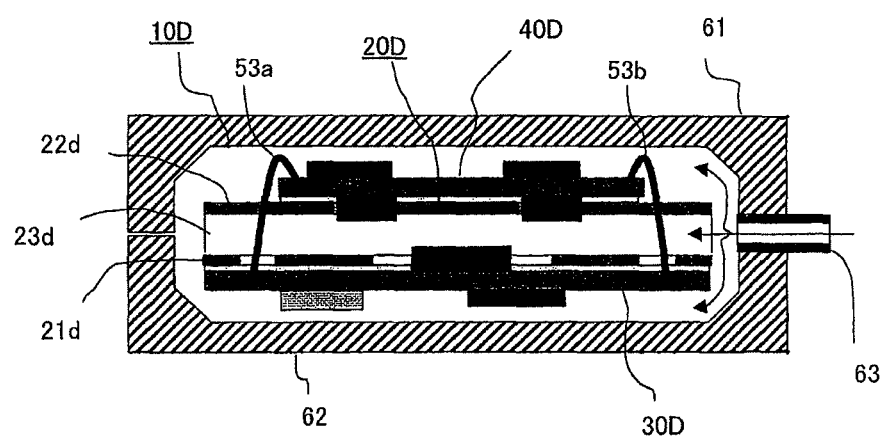
FIG. 16 is a sectional view of a molding die used for the fabrication of the electronic control device illustrated in FIG. 13.

FIG. 16 is a sectional view of the molding die used for the fabrication of the electronic control device 10D illustrated in FIGS. 1A and 1B.

Inside the molding die constituted of the upper die 61 and the lower die 62, the electronic control device 10D before being molded with the resin is placed, in which the external connection terminals 52a and 52b are connected to the second electronic board 40D through an intermediation of the bonding wires 49a and 49b.

The resin injection port 63 is provided in the center position of the molding die on the side where the bonding wires 53b are provided.

The thermosetting resin, which is heated and melted, is injected under pressure through the resin injection port 63 into the space closed by the upper die 61 and the lower die 62. The thermosetting resin is, for example, an epoxy resin composition.

The flow of the synthetic resin which is injected through the resin injection port 63 under pressure is split into three streams, as indicated by arrows of FIG. 16. A first stream flows into an upper space on the outer mounting surface of the second electronic board 40D, a second stream flows into an inside space surrounded by the second electronic board 40D, the rising portions 23d, and the bottom surface portion 21d, and a third stream flows into a lower space under the outer mounting surface of the first electronic board 30D. Then, the three streams join together downstream, that is, on the side where the bonding wires 53a are provided.

The thermosetting resin has a characteristic of not being softened or melted by re-heating once cured after heating and melting. Therefore, the gel-like adhesives 35 and 45, which are the thermosetting resin compositions, are not softened at the time of heat-molding of the exterior covering material 11 by being thermally cured after the application and the bonding.

A thermoplastic resin may alternatively be used as the exterior covering material 11. If the thermoplastic resin is used, the exterior covering material 11 is melted by re-heating. Therefore, the components included in the electronic control device 10D can be collected separately after the use.

As described above, according to the electronic control device 10D of this fourth embodiment, the support member 20D includes the bottom surface portion 21d corresponding to the first support portion, through which the window hole 24d and the wiring slits 27d are formed. The first electronic board 30D having the outer mounting surface on which the outer circuit components 31 are mounted and the inner mounting surface on which the inner circuit components 33 are mounted is bonded to the bottom surface portion 21d. The second electronic board 40D having the outer mounting surface on which the outer circuit components 41 are mounted and the inner mounting surface on which the inner circuit components 43 are mounted is bonded to the plane portions 22d corresponding to the second support portion.

Therefore, the support member 20D supports the first electronic board 30D and the second electronic board 40D, each having two surfaces on both of which the components are mounted, at a distance from each other. Thus, the areas on which the circuit components 31, 33, 41, and 43 are mounted can be increased without increasing a plane area of each of the electronic boards. As a result, a plane area and a volume of the entire electronic control device 10D can be prevented from being increased.

Moreover, the bottom surface portion 21d, the plane portions 22d, and the rising portions 23d of the support member 20D are formed by bending the rectangular metal sheet material having a high thermal conductivity. Thus, the support member 20D can be easily fabricated. In addition, the heat-radiating property for the heat-generating components 32 and 42, which are opposed to the support member 20D with the first electronic board 30D and the second electronic board 40D interposed therebetween, is improved.

In addition, the heat-generating components 32 are provided in the region of the first electronic board 30D, which is located at the position vertically corresponding to that of the bottom surface portion 21d, whereas the heat-generating components 42 are provided in regions of the second electronic board 40D, which are located at the positions vertically corresponding to those of the plane portions 22d. Therefore, the heat-generating components 32 and 42 are mounted so as not to be located at the positions which vertically correspond to each other. In this manner, the temperature can be prevented from being locally excessively high.

The external connection terminals 52a and 52b, each having the distal end extending vertically with respect to the first edges, are arranged at intervals along the rising portions 23d. The resin injection port 63 of the die is formed at the position corresponding to the middle of the second edge on one side so as to be oriented to the space portion surrounded by the first electronic board 30D, the second electronic board 40D, and the pair of rising portions 23d.

Thus, the heated and melted synthetic resin is injected under pressure to pass through the interspaces between the adjacent bonding wires 53b into the die through the resin injection port 63 without being interfered by the external connection terminals 52a and 52b. As a result, the structure of the die is simplified.

The first electronic board 30D and the second electronic board 40D are electrically connected to each other by the bonding wires 53a and 53b at the second edges.

Specifically, the bonding wires 53a and 53b are provided to the second edges corresponding to the lateral sides of the first electronic board 30D and the second electronic board 40D, whereas the external connection terminals 52a and 52b are provided to the first edges corresponding to the longitudinal sides of the first electronic board 30D. Therefore, the positions where the electrical wirings are provided are distributed. As a result, the overall size of the electronic control device 10D can be reduced.

Moreover, the plurality of board-to-board connection lands are provided at intervals on the first electronic board 30D and the second electronic board 40D along the second edges extending vertically with respect to the rising portions 23d. Both ends of the bonding wires 53a and 53b are respectively connected to the board-to-board connection lands provided to the first electronic board 30D and those provided to the second electronic board 40D, and hence, the first electronic board 30D and the second electronic board 40D are electrically connected to each other.

Thus, the heated and melted synthetic resin passes through the interspaces between the adjacent bonding wires 53a and 53b. Accordingly, the synthetic resin can smoothly flow into the die.

Further, the synthetic resin flows into the die along a direction in which each of the bonding wires 53a and 53b is provided to extend. Therefore, the load applied to the bonding wires 53a and 53b at the time of the injection of the synthetic resin under pressure is reduced to prevent the bonding wires 53a and 53b from being broken.

Further, the first electronic board 30D and the second electronic board 40D are previously bonded to the support member 20D by curing the adhesives 35 and 45 with heating. Then, the external connection terminals 52a and 52b are electrically connected to the first electronic board 30D through an intermediation of the bonding wires 49a and 49b. Then, the first electronic board 30D and the second electronic board 40D are electrically connected to each other by the bonding wires 53a and 53b to fabricate the unmolded body. After the fabrication of the unmolded body in the manner described above, the unmolded body is placed inside the die. Then, the heated and melted synthetic resin is injected under pressure into the die along the rising portions 23d to form the exterior covering material 11 by molding.

Therefore, the adhesives 35 and 45, each being the thermosetting resin, are not melted or softened by the heat of the melt synthetic resin at the time of pressure-molding. Therefore, all the components are reliably integrated with each other.

Further, the synthetic resin, which is injected under pressure, is split inside the die into three streams flowing into the space portion surrounded by the first electronic board 30D, the second electronic board 40D, and the rising portions 23d, into the upper space above the second electronic board 40D, and into the lower space below the first electronic board 30D. Therefore, the pressure is distributed at the time of the injection of the synthetic resin under pressure, and hence, the first electronic board 30D and the second electronic board 40D are prevented from being deformed.

Further, the internal space of the die is uniformly filled with the heated and melted synthetic resin, which can realize a non-hollow structure. Accordingly, the peel-off of the solders from the outer circuit components 31, the inner circuit components 33, and the heat-generating components 32 and 42, and the separation between the members such as the first electronic board 30D, the second electronic board 40D, the support member 20D, and the exterior covering material 11 can be prevented from occurring due to the expansion and shrinkage of air with a change in environmental temperature during actual use.

Figure 17A:
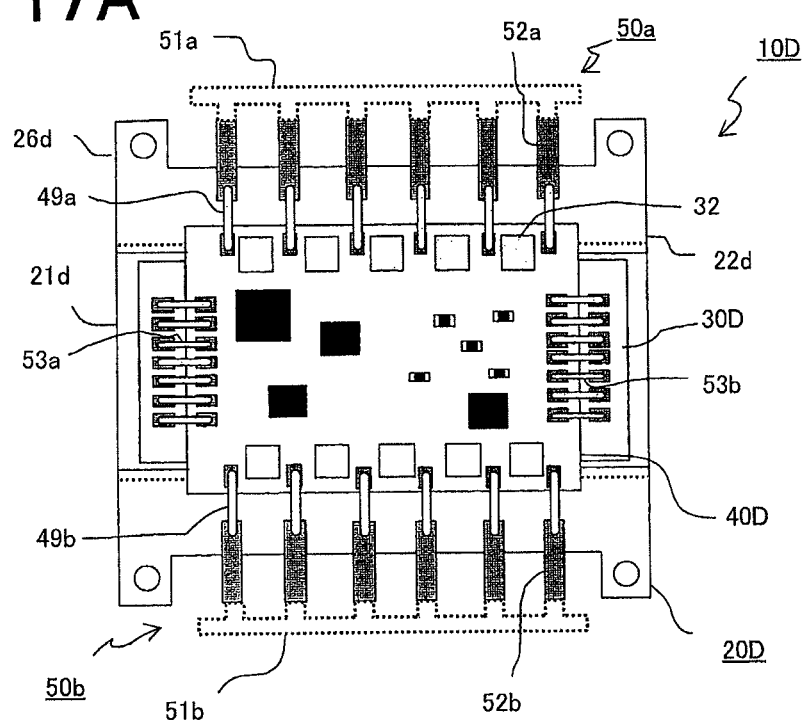
FIG. 17A is a top view illustrating another example of an electronic control device according to a fourth embodiment of the present invention before the electronic control device is sealed with a resin.
Figure 17B:
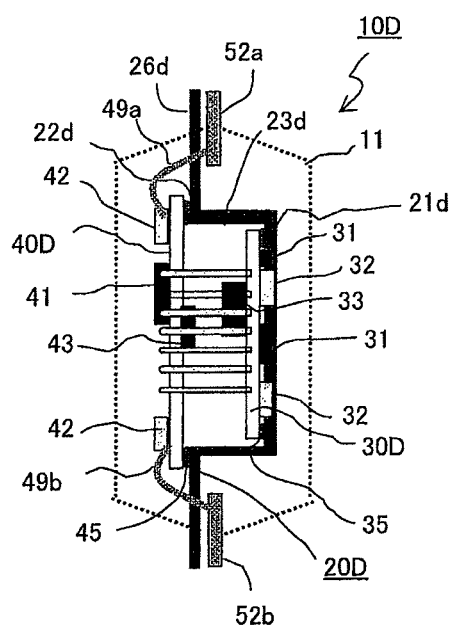
FIG. 17B is a right side view of FIG. 17A.

As illustrated in FIGS. 17A and 17B, the first electronic board 30D may be bonded to the bottom surface portion 21d so as to directly face the second electronic board 40D in a region between the pair of rising portions 23d opposed to each other.

In this case, there are obtained effects of eliminating the wiring slits 27d for electrically connecting the first electronic board 30D and the second electronic board 40D from the bottom surface portion 21d.

In the description of the electronic control device according to each of the first to fourth embodiments described above, each of the first electronic boards 30A, 30B, 30C, and 30D, and the second electronic boards 40A, 40B, 40C, and 40D is the glass epoxy resin board having the two surfaces on both of which the components are mounted, and the heat-generating components 32 are mounted on each of the first electronic boards 30A, 30B, 30C, and 30D and the heat-generating components 42 are mounted on each of the second electronic boards 40A, 40B, 40C, and 40D. However, for example, each of the first electronic boards 30A, 30B, 30C, and 30D may be a multilayered high-density double-sided mounting board without carrying the heat-generating components 32 thereon, and each of the second electronic boards 40A, 40B, 40C, and 40D may be a single-sided mounting board having a surface on which the heat-generating components 42 are mounted.

Moreover, the rising portions 23a, 23b, and 23c corresponding to the spacer portions are respectively formed on both ends of the first support plates 21a, 21b, and 21c of the support members 20A, 20B, and 20C according to the first to third embodiments. However, the rising portions corresponding to the spacer portions may alternatively be provided to both ends of the second support plate.

Further, the glass epoxy resin board, which is a low-cost material, is used as a material of each of the electronic boards 30A, 30B, 30C, 30D, 40A, 40B, 40C, and 40D. However, a ceramic board may be used instead. In the case where the ceramic board is used, the heat-radiating property for the heat-generating components 32 and 42 is further improved. As a result, mounting at a higher density can be realized. In addition, the electronic control device is further reduced in size.

Although each of the electronic control devices 10A to 10D according to the first to fourth embodiments has been described taking the transmission control device for the automobile transmission as an example, it is apparent that the electronic control device of the present invention is not limited thereto.

For example, the present invention is also applicable to a drive control device for a radiator fan of a water-cooled automobile engine control device and an intake air amount detection control device for an automobile engine control device.

What is claimed is:

1. A resin-sealed electronic control device, comprising:
external connection terminals electrically connected to an external apparatus;
a first electronic board and a second electronic board, at least one of the first electronic board and the second electronic board having two surfaces on both of which a plurality of circuit components are mounted;
a support member onto which the first electronic board and the second electronic board are bonded; and
an exterior covering material covering each of the entire first electronic board and the entire second electronic board, the external connection terminals, and the support member with a synthetic resin so that the external connection terminals and the support member are partially exposed therefrom, wherein:
the support member includes:
a first support portion to which the first electronic board is bonded;
a second support portion to which the second electronic board is bonded; and
a pair of spacer portions provided to keep the second support portion and the first support portion at a distance from each other, the pair of spacer portions forming a space portion with the first electronic board and the second electronic board;
the exterior covering material is formed by injecting the synthetic resin being heated and melted, into the space portion and spaces outside the space portion along the pair of spacer portions;
the plurality of circuit components include:
inner circuit components provided inside the space portion; and
outer circuit components provided outside the space portion; and
the inner circuit components are situated inside one of a window hole formed through the support member or a depressed portion provided to the support member so that the inner circuit components are prevented from being brought into contact with the support member, the inner circuit components facing one of the first electronic board and the second electronic board, the first electronic board and the second electronic board being opposed to each other, with a gap interposed therebetween.

2. A resin-sealed electronic control device according to claim 1, wherein the outer circuit components include heat-generating components provided in regions of the first electronic board and the second electronic board, the regions being situated at positions vertically corresponding to the support member having a thermal conductivity.

3. A resin-sealed electronic control device according to claim 1, wherein:
the external connection terminals, each having a distal end extending vertically with respect to the spacer portions, are arranged at intervals along the spacer portions; and
the first electronic board and the second electronic board are electrically connected at second edges of the first electronic board and the second electronic board, the second edges extending between the spacer portions.

4. A resin-sealed electronic control device according to claim 3, wherein:
each of the first electronic board and the second electronic board includes a plurality of board-to-board connection lands arranged at intervals along the second edges, and the first electronic board (30A, 30D) and the second electronic board (40A, 40D) are electrically connected to each other by connecting ends of a plurality of bonding wires (53a, 53b) on one side to the board-to-board connection lands provided to the first electronic board and the ends of the plurality of bonding wires on another side to the board-to-board connection lands provided to the second electronic board; and
each of the external connection terminals is electrically connected to any one of the first electronic board and the second electronic board.

5. A resin-sealed electronic control device according to claim 1, wherein:
the external connection terminals, each having a distal end extending along the spacer portions, are arranged at intervals and separated at least into a first group and a second group along second edges of the first electronic board and the second electronic board, the second edges extending between the spacer portions, the first group and the second group being arranged at a distance from each other;
the synthetic resin being melted is injected into the exterior covering material from a position between the first group and the second group; and
the first electronic board and the second electronic board are electrically connected to each other at one of the second edges and first edges of the first electronic board and the second electronic board, the first edges extending along the spacer portions.

6. A resin-sealed electronic control device according to claim 5, wherein:
each of the first electronic board and the second electronic board includes a plurality of board-to-board connection lands arranged along the first edges, and the first electronic board and the second electronic board are electrically connected to each other by connecting ends of flexible boards on one side to the board-to-board connection lands provided to the first electronic board and ends of the flexible boards on another side to the board-to-board connection lands provided to the second electronic board; and
each of the external connection terminals is electrically connected to any one of the first electronic board and the second electronic board.

7. A resin-sealed electronic control device according to claim 5, wherein:

each of the first electronic board and the second electronic board includes a plurality of board-to-board connection lands arranged along one of the first edges and the second edges, and the first electronic board and the second electronic board are electrically connected to each other by one of connecting the board-to-board connection lands provided along the first edges to each other and connecting the board-to-board connection lands provided along the second edges to each other through ends of bonding wires; and each of the external connection terminals is electrically connected to any one of the first electronic board and the second electronic board.

8. A resin-sealed electronic control device according to claim 1, wherein:

the external connection terminals, each having a distal end extending vertically with respect to the spacer portions, are arranged at intervals and separated at least into a first group and a second group along first edges of the first electronic board and the second electronic board, the first edges extending along the spacer portions, the first group and the second group being arranged at a distance from each other; and the first electronic board and the second electronic board are electrically connected to each other at one of the first edges and second edges of the first electronic board and the second electronic board, the second edges extending between the spacer portions.

9. A resin-sealed electronic control device according to claim 8, wherein:

each of the first electronic board and the second electronic board includes a plurality of board-to-board connection lands arranged along one of the first edges and the second edges;

one of the board-to-board connection lands provided along the first edges between the first group and the second group and the board-to-board connection lands provided along the second edges are connected to each other through an intermediation of bonding wires; and each of the external connection terminals is electrically connected to any one of the first electronic board and the second electronic board.

10. A resin-sealed electronic control device according to claim 1, wherein:

the first support portion comprises a first support plate made of a rectangular sheet metal material, which has rising portions corresponding to the spacer portions at both ends, and the second support portion comprises a second support plate made of a rectangular sheet metal material, which is firmly bonded to an end of each of the rising portions.

11. A resin-sealed electronic control device according to claim 1, wherein:

the support member is made of a sheet metal material, in which a middle portion is bent to have a U-like cross section so that a bottom surface portion and a pair of rising portions opposed to each other form the depressed portion, and which has plane portions formed by bending an end of each of the rising portions at a right angle so that the ends of the rising portions extend in opposite directions away from each other; and the first support portion is the bottom surface portion, the spacer portions are the rising portions, and the second support portion is the plane portions.

12. A resin-sealed electronic control device according to claim 11, wherein the first electronic board is bonded to the bottom surface portion between the rising portions so that the first electronic board directly faces the second electronic board.

* * * * *